(12) United States Patent
Okumura

(10) Patent No.: US 9,142,542 B2
(45) Date of Patent: Sep. 22, 2015

(54) SEMICONDUCTOR DEVICE WITH PROTECTIVE DIODE

(75) Inventor: Keiji Okumura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 64 days.

(21) Appl. No.: 13/824,338

(22) PCT Filed: Sep. 13, 2011

(86) PCT No.: PCT/JP2011/070887
§ 371 (c)(1),
(2), (4) Date: Mar. 15, 2013

(87) PCT Pub. No.: WO2012/036165
PCT Pub. Date: Mar. 22, 2012

(65) Prior Publication Data
US 2013/0175549 A1    Jul. 11, 2013

(30) Foreign Application Priority Data

Sep. 15, 2010   (JP) ................. 2010-207216

(51) Int. Cl.
| | |
|---|---|
| *H01L 27/02* | (2006.01) |
| *H01L 29/66* | (2006.01) |
| *H01L 29/739* | (2006.01) |
| *H01L 29/78* | (2006.01) |
| *H01L 29/861* | (2006.01) |
| *H01L 27/06* | (2006.01) |
| *H01L 29/06* | (2006.01) |
| *H01L 29/16* | (2006.01) |
| *H01L 29/45* | (2006.01) |
| *H01L 29/49* | (2006.01) |

(52) U.S. Cl.
CPC ........ *H01L 27/0255* (2013.01); *H01L 27/0629* (2013.01); *H01L 29/66068* (2013.01); *H01L 29/7395* (2013.01); *H01L 29/7808* (2013.01); *H01L 29/7811* (2013.01); *H01L 29/861* (2013.01); *H01L 29/0619* (2013.01); *H01L 29/0696* (2013.01); *H01L 29/1608* (2013.01); *H01L 29/45* (2013.01); *H01L 29/4916* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,688,323 A | 8/1987 | Yoshida et al. | |
| 4,831,424 A | 5/1989 | Yoshida et al. | |
| 2002/0190313 A1 | 12/2002 | Takaishi et al. | |
| 2003/0057497 A1* | 3/2003 | Higashida et al. | ............ 257/356 |
| 2007/0252168 A1* | 11/2007 | Shimoida et al. | ............ 257/147 |

FOREIGN PATENT DOCUMENTS

| | | |
|---|---|---|
| JP | 58-025264 | 2/1983 |
| JP | 5-090594 | 4/1993 |

(Continued)

*Primary Examiner* — Daniel Luke
(74) *Attorney, Agent, or Firm* — Rabin & Berdo, P.C.

(57) ABSTRACT

A semiconductor device (1) includes an n type epitaxial layer (8), body regions (12) formed in the surface layer part of the n type epitaxial layer (8), n type source regions (16) formed in the surface layer parts of the body regions (12), a gate insulating film (19) formed on the n type epitaxial layer (8), and a gate protection diode (30) and gate electrodes (20) formed on the gate insulating film (19). The gate protection diode (30) includes a first p type region (31), an n type region (32), and a second p type region (33). A first diode (30A) is formed of the first p type region (31) and the n type region (32). A second diode (30B) is formed of the n type region (32) and the second p type region (33). The first p type region (31) is connected to the gate electrode (20). The second p type region (33) is connected to a source electrode (27).

19 Claims, 19 Drawing Sheets

(56) References Cited

FOREIGN PATENT DOCUMENTS

| JP | 2000-22144 | 1/2000 |
|---|---|---|
| JP | 2000-294778 | 10/2000 |
| JP | 2000-294779 | 10/2000 |
| JP | 2001-326354 | 11/2001 |
| JP | 2002-314085 | 10/2002 |
| JP | 2002-373988 | 12/2002 |
| JP | 2003-347548 | 12/2003 |
| JP | 2004-214353 | 7/2004 |

* cited by examiner

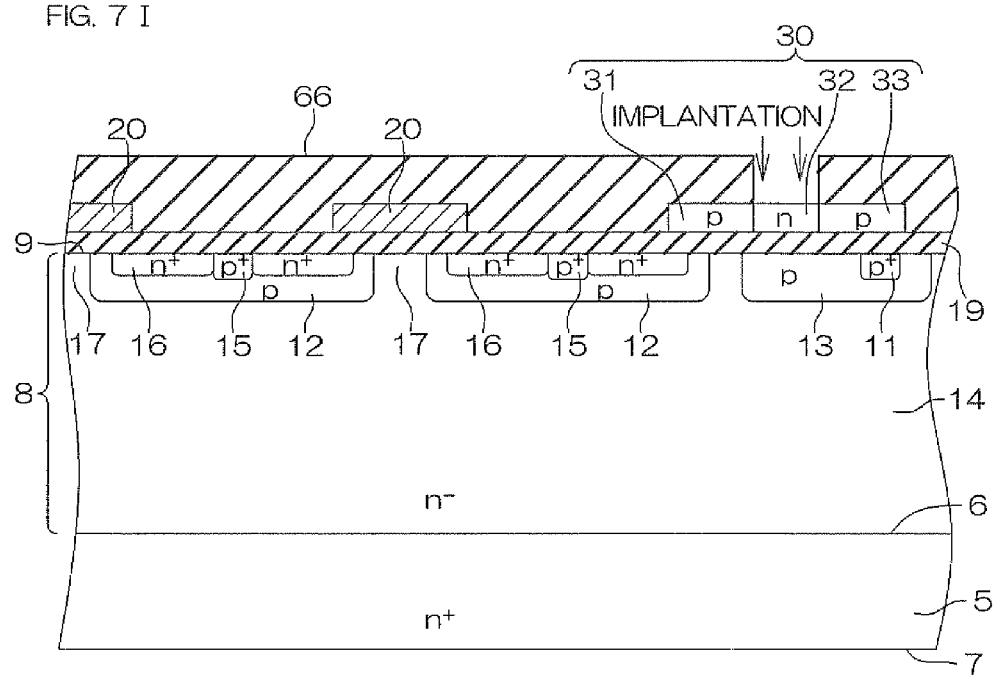
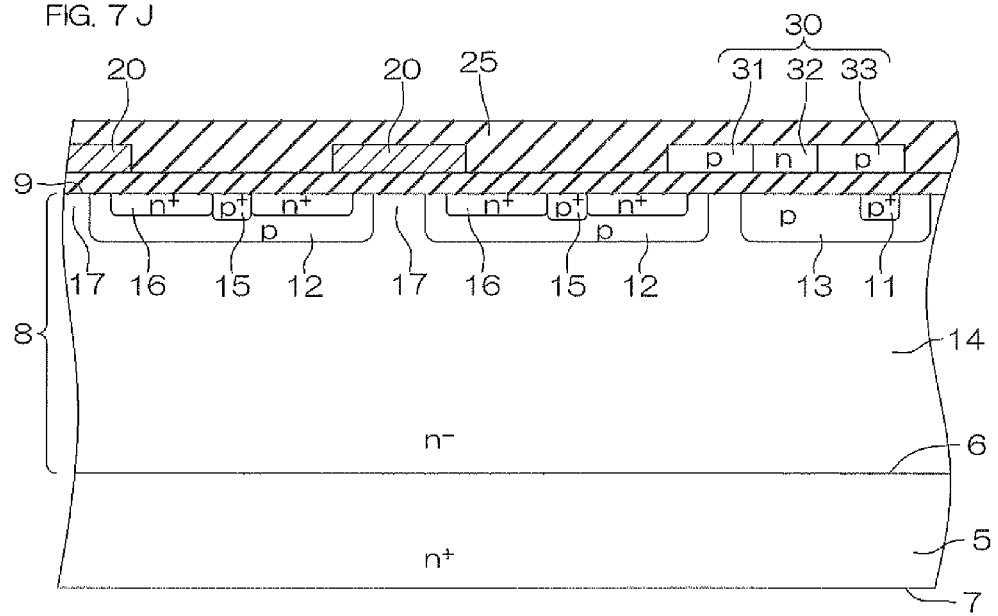

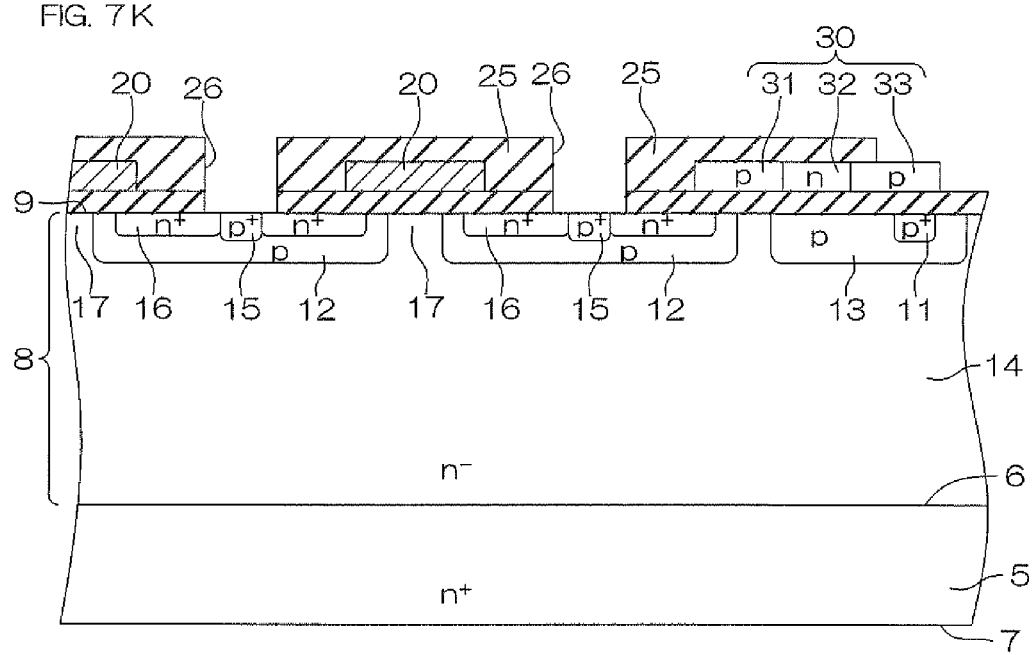

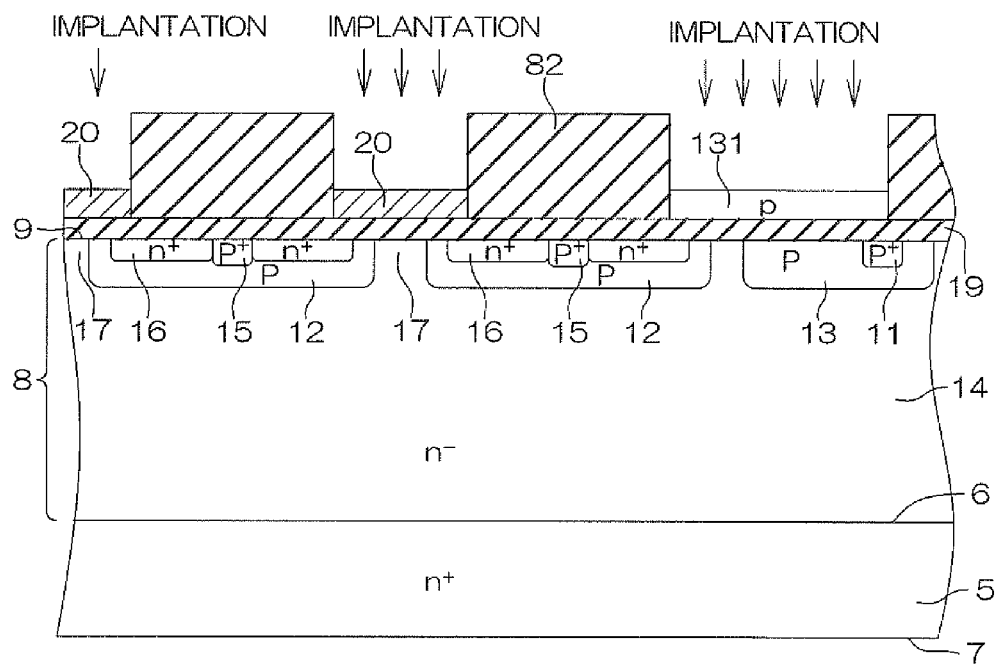
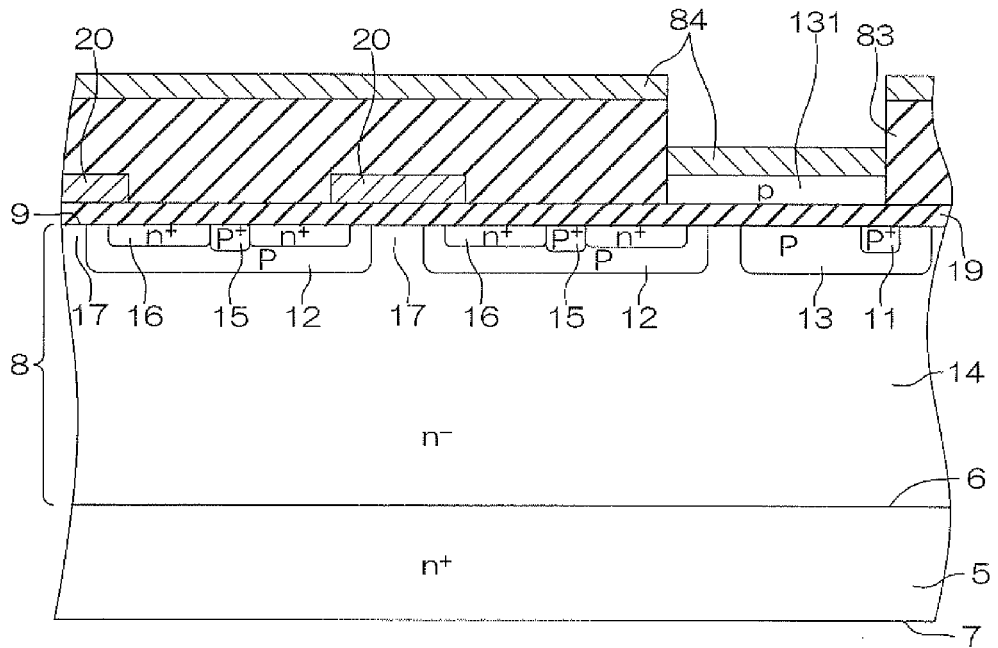

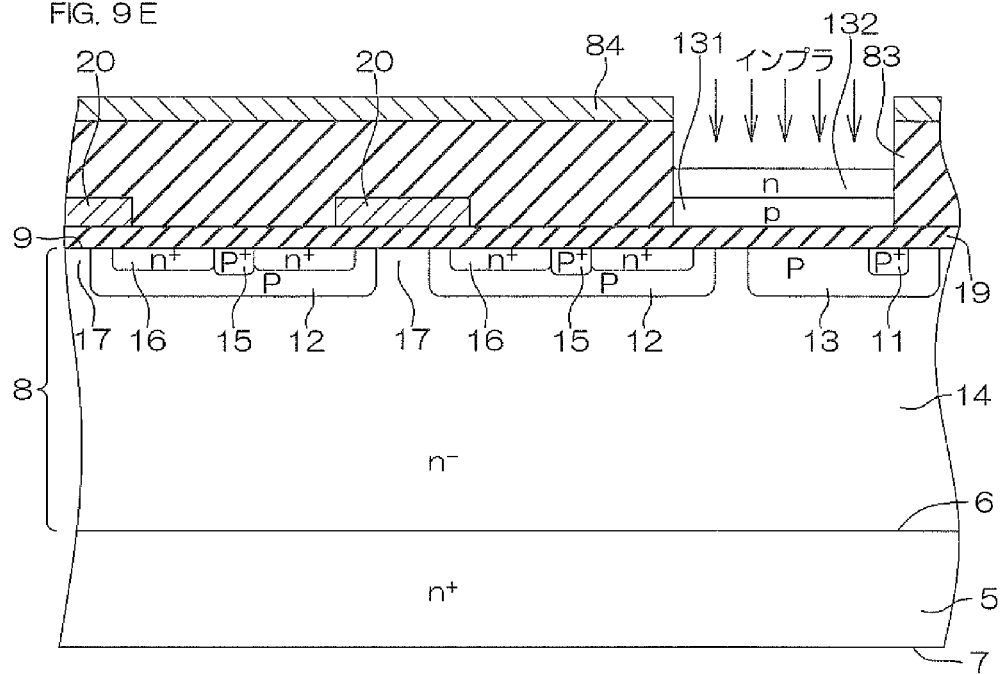
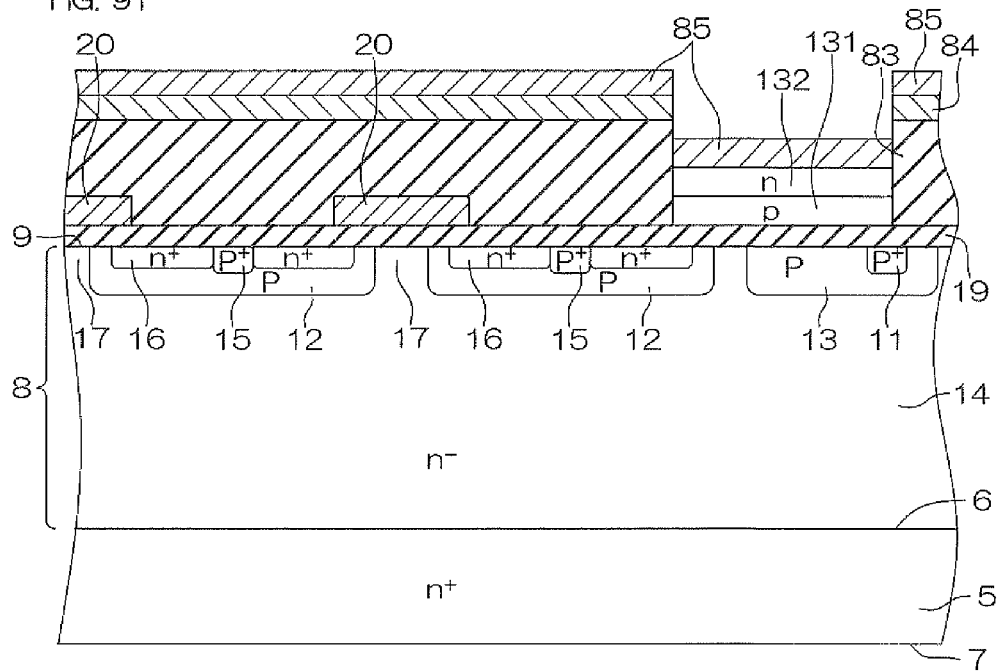

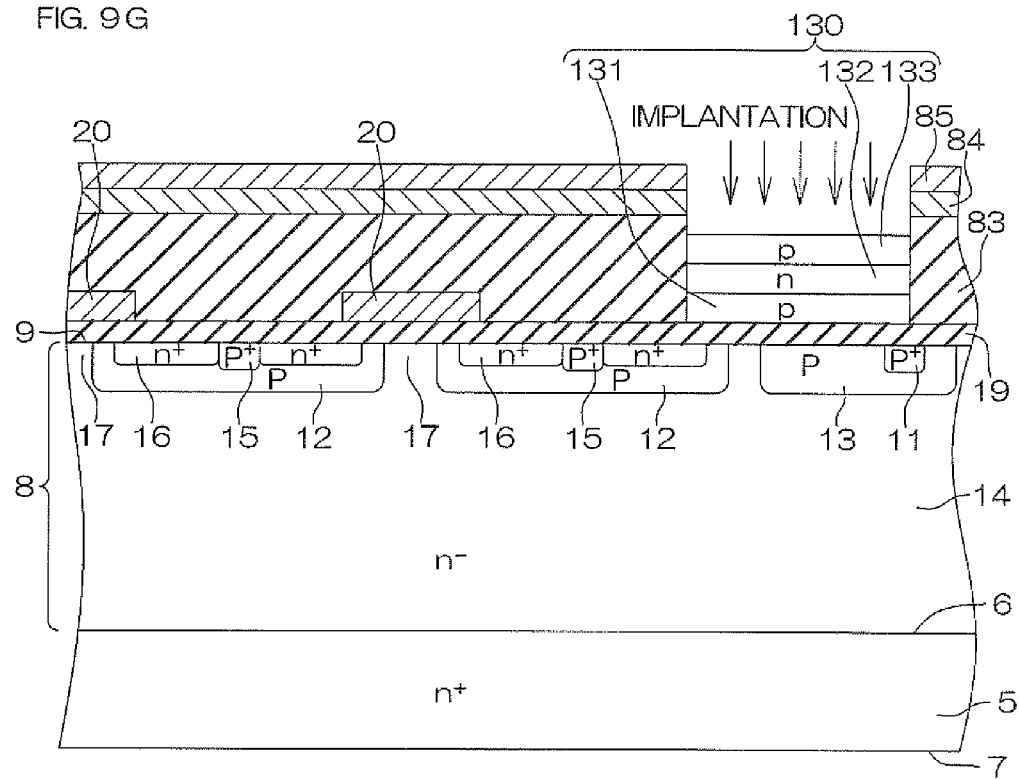
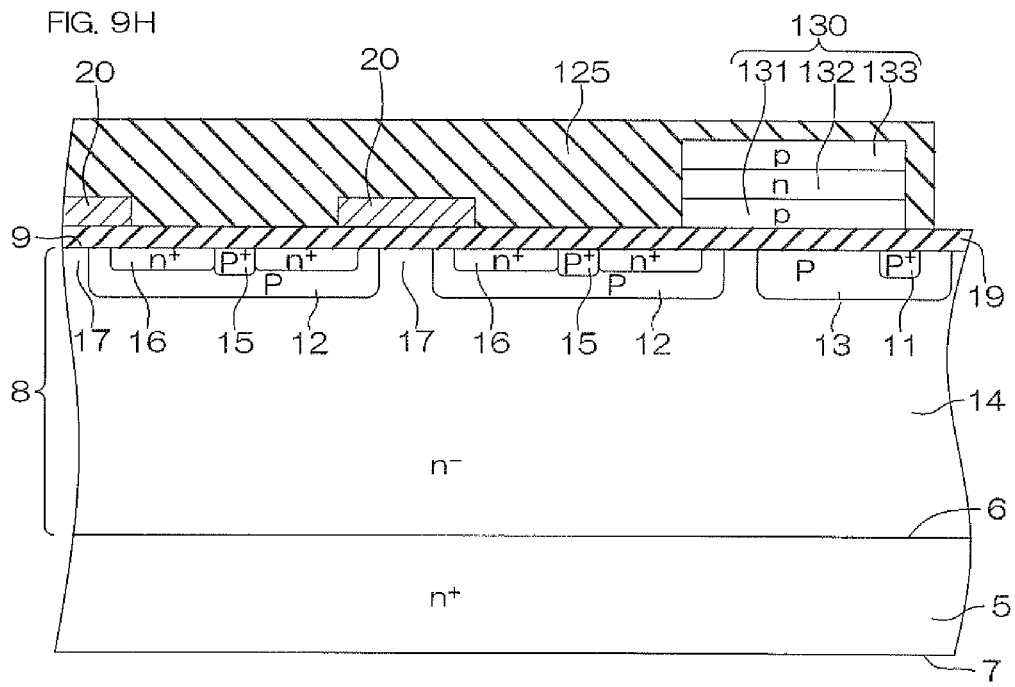

SEMICONDUCTOR DEVICE WITH PROTECTIVE DIODE

TECHNICAL FIELD

The present invention relates to a semiconductor device, and, more particularly, to a semiconductor device for use in the power electronics field.

BACKGROUND ART

A high-voltage semiconductor device (power device) to which a high voltage is applied is used in the power electronics field. A MOSFET (Metal-Oxide-Semiconductor Field Effect Transistor) composed mainly of SiC (silicon carbide) can be mentioned as a typical power device.

CITATION LIST

Patent Literature

PTL 1: Japanese Unexamined Patent Publication No. 2003-347548

SUMMARY OF INVENTION

Technical Problem

In a conventional MOSFET composed mainly of SiC, a problem lies in the fact that a threshold voltage (gate threshold value) is varied when a voltage continues to be applied to a gate. Especially when a voltage of +30 V or more is applied between the gate and the source of the MOSFET, the threshold value rises greatly. Additionally, when a voltage of −10 V or less is applied between the gate and the source of the MOSFET, the threshold value falls greatly.

When the threshold value of the MOSFET rises, the on-resistance rises, and, in the worst case, there is a fear that the MOSFET will not be turned on even if a gate voltage is applied to the gate. On the other hand, when the threshold value of the MOSFET falls, there is a fear that the MOSFET will be turned on even if a gate voltage is not applied to the gate.

It is an object of the present invention to provide a semiconductor device capable of restraining or preventing a variation in gate threshold values.

Solution to Problem

The semiconductor device of the present invention includes a source or an emitter region and a drain or a collector region that are made of an SiC semiconductor, a channel region that is made of an SiC semiconductor and that is disposed between the source or the emitter region and the drain or the collector region, a gate that faces the channel region with a gate insulating film between the gate and the channel region, and a diode connected between the gate and the source or the emitter region.

According to this arrangement, a voltage that is applied between the gate and the source or the emitter region can be limited by the diode connected therebetween. More specifically, a voltage that is applied between the gate and the source or the emitter region can be limited by a limited voltage according to a reverse breakdown voltage of the diode connected therebetween. In other words, when a great voltage is applied between the gate and the source or the emitter region, the diode breaks down, and therefore a voltage that exceeds the reverse breakdown voltage is never applied between the gate and the source or the emitter region. As a result, a variation in the gate threshold value can be restrained or prevented.

In one embodiment of the present invention, the diode includes two diodes that are connected in anti-series to each other between the gate and the source or the emitter region.

One of the two diodes that is connected so that a direction followed from the gate to the source or to the emitter region is a forward direction is defined as a first diode, whereas the other diode that is connected so that a direction followed from the source or from the emitter region to the gate is a forward direction is defined as a second diode. According to this arrangement, a voltage in one direction applied between the gate and the source or the emitter region is limited to the reverse breakdown voltage of the first diode, whereas a voltage in an opposite direction applied between the gate and the source or the emitter region is limited to the reverse breakdown voltage of the second diode. As a result, a variation in the gate threshold value can be restrained or prevented.

In one embodiment of the present invention, the diode is arranged so as to limit a voltage that is applied between the gate and the source or the emitter region. According to this arrangement, a voltage that is applied between the gate and the source or the emitter region is limited by the diode. As a result, a variation in the gate threshold value can be restrained or prevented.

In one embodiment of the present invention, the diode is arranged so as to limit a voltage that is applied between the gate and the source or the emitter region to a voltage between a positive first limited voltage and a negative second limited voltage on a basis of the source or the emitter region. An absolute value of the first limited voltage is determined to be greater than an absolute value of the second limited voltage.

According to this arrangement, a voltage that is applied between the gate and the source or the emitter region is limited to a voltage between the positive first limited voltage and the negative second limited voltage. As a result, a variation in the gate threshold value can be restrained or prevented. The absolute value of an applied voltage by which the gate threshold value is greatly varied when a positive voltage is applied between the gate and the source or the emitter region is greater than the absolute value of an applied voltage by which the gate threshold value is greatly varied when a negative voltage is applied between the gate and the source or the emitter region. Therefore, in this arrangement, the absolute value of the first limited voltage is determined to be greater than the absolute value of the second limited voltage.

In one embodiment of the present invention, the diode is arranged so as to limit a voltage that is applied between the gate and the source or the emitter region to a value below a positive first limited voltage on a basis of the source or the emitter region. The first limited voltage is determined to be greater than a threshold voltage for electrical conduction between the source or the emitter region and the drain or the collector region and to be smaller than a withstand voltage of the gate insulating film. A voltage that is applied between the gate and the source or the emitter region is limited to a value below the positive first limited voltage, and therefore a variation in the gate threshold value can be restrained or prevented. Additionally, the first limited voltage is determined to be greater than a threshold voltage for electrical conduction between the source or the emitter region and the drain or the collector region, and therefore electrical conduction between the source or the emitter region and the drain or the collector region can be performed by applying a predetermined gate voltage smaller than the positive first limited voltage to the gate. Additionally, the first limited voltage is determined to be smaller than the withstand voltage of the gate insulating film, and therefore the gate insulating film can be prevented from being destroyed.

In one embodiment of the present invention, the first limited voltage is 33 V or less. According to this arrangement, the voltage that is applied between the gate and the source or the emitter region is limited by the first limited voltage of 33 V or less. As a result, a variation in the gate threshold value can be restrained or prevented.

In one embodiment of the present invention, the second limited voltage is −7 V or more. According to this arrangement, the negative voltage that is applied between the gate and the source or the emitter region is limited by the second limited voltage of −7 V or more. As a result, a variation in the gate threshold value can be restrained or prevented.

In one embodiment of the present invention, the diode is made of a material composed mainly of Si.

In one embodiment of the present invention, the diode is formed at an outer peripheral part of the semiconductor device.

The aforementioned or other objects, features, and effects of the present invention will be clarified by the following description of embodiments with reference to the accompanying drawings.

BRIEF DESCRIPTION OF DRAWINGS

FIG. 1A is an overall view of the semiconductor device, and FIG. 1B is an enlarged view of an internal structure of the semiconductor device.

FIG. 4A shows a variation in the threshold voltage $V_{th}$, and FIG. 4B shows a variation in the amount of variation $\Delta V_{th}$ of the threshold voltage.

FIG. 5A shows a variation in the threshold voltage $V_{th}$, and FIG. 5B shows a variation in the amount of variation $\Delta V_{th}$ of the threshold voltage.

DESCRIPTION OF EMBODIMENTS

Figure 1:
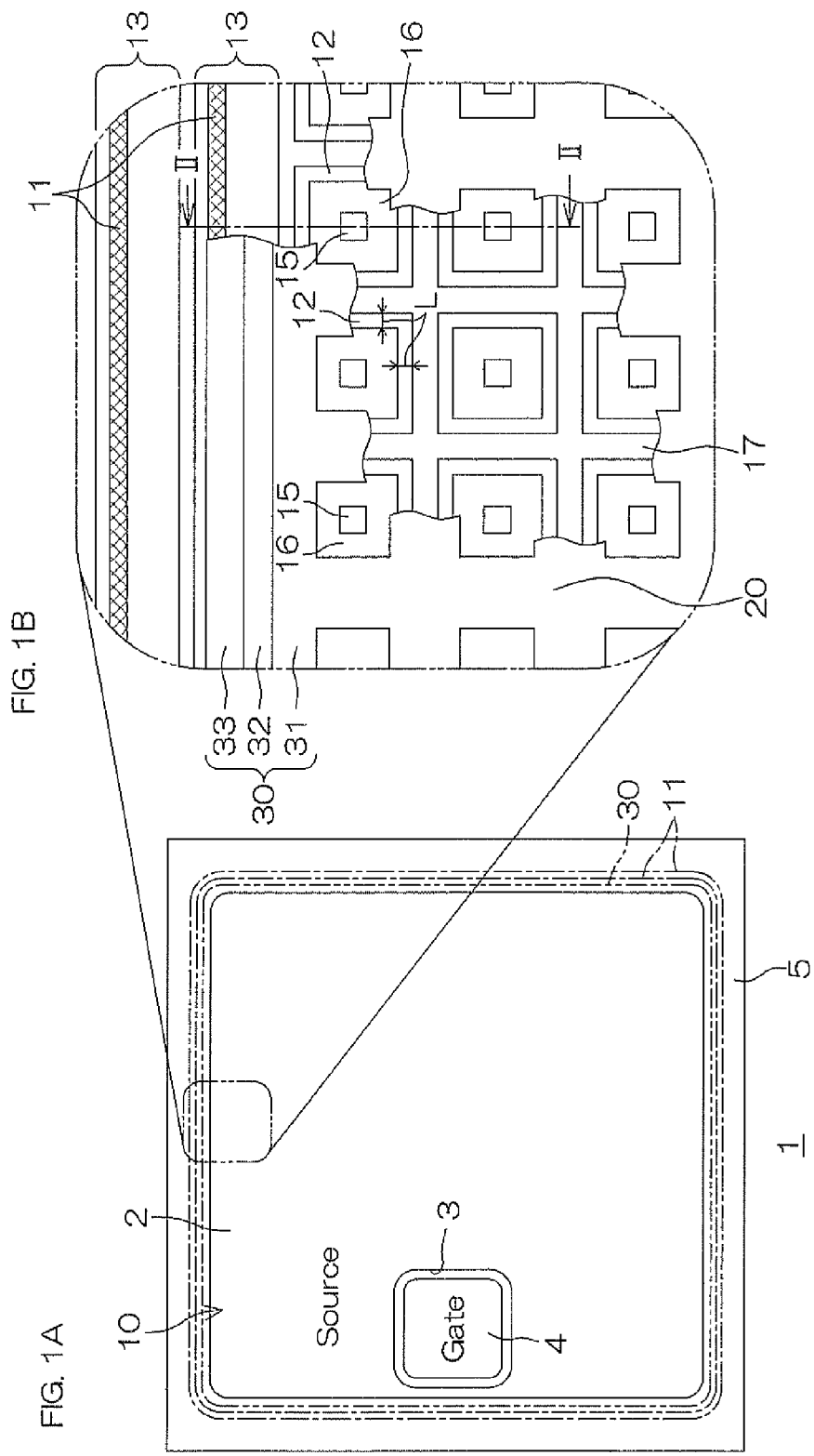
FIG. 1A and FIG. 1B are schematic plan views of a semiconductor device according to a first embodiment of the present invention.

Embodiments of the present invention will be hereinafter described in detail with reference to the accompanying drawings.

FIG. 1A and FIG. 1B are schematic plan views of a semiconductor device according to a first embodiment of the present invention. FIG. 1A is an overall view of the semiconductor device, and FIG. 1B is an enlarged view of an internal structure of the semiconductor device. FIG. 2 is a sectional view showing a cutting plane along the cutting-plane line II-II of FIG. 1B.

The semiconductor device 1 is a planar-gate type MOSFET that uses SiC, and has the shape of, for example, a square chip when viewed planarly as shown in FIG. 1A. This semiconductor device 1 has a length of, for example, several millimeters (mm) in each of the up-down and right-left directions in the drawing sheet of FIG. 1A.

A source pad 2 is formed on the surface of the semiconductor device 1. The source pad 2 has a substantially square shape whose four corners are bent outwardly when viewed planarly, and is formed so as to cover substantially the whole of the surface of the semiconductor device 1. The source pad 2 has its one side near the center of which a removal region 3 whose shape is substantially square when viewed planarly is formed. The removal region 3 is a region in which the source pad 2 is not formed.

A gate pad 4 is disposed in the removal region 3. A gap lies between the gate pad 4 and the source pad 2, which are insulated from each other.

Next, an internal structure of the semiconductor device 1 will be described.

The semiconductor device 1 includes an n$^+$ type (e.g., the n type impurity concentration is $1\times10^{18}$ cm$^{-3}$ to $1\times10^{22=-3}$) SiC substrate 5. In the present embodiment, the SiC substrate 5 functions as a drain region of the semiconductor device 1, and its obverse surface (upper surface) 6 is an Si plane (silicon plane), whereas its reverse surface (lower surface) 7 is a C plane (carbon plane). The obverse surface 6 of the SiC substrate 5 is an Si plane whose off-angle is 0 degrees to 10 degrees (preferably, 0 degrees to 5 degrees).

An n$^-$ type epitaxial layer 8 that is made of SiC and that is lower in concentration than the SiC substrate 5 (e.g., the n type impurity concentration is $1\times10^{15}$ cm$^{-3}$ to $1\times10^{17}$ cm$^{-3}$) is stacked on the SiC substrate 5. The epitaxial layer 8 serving as a semiconductor layer is formed on the SiC substrate 5 by means of so-called epitaxial growth. The epitaxial layer 8 formed on the obverse surface 6 that is an Si plane is grown in a state in which the Si plane serves as a growth principal plane. Therefore, the obverse surface 9 of the epitaxial layer 8 formed by epitaxial growth is the same Si plane as the obverse surface 6 of the SiC substrate 5. More specifically, the surface 9 of the epitaxial layer 8 is the same Si plane whose off-angle is, for example, 0 degrees to 10 degrees (preferably, 0 degrees to 5 degrees) as the SiC substrate 5.

As shown in FIG. 1A, the semiconductor device 1 has an active region 10 that is disposed at a central part on the epitaxial layer 8 when viewed planarly and that functions as a field-effect transistor. The epitaxial layer 8 has a plurality of guard rings 11 (two guard rings in the present embodiment) at distances, respectively, from the active region 10 so as to surround the active region. A gap between the active region 10 and the guard ring 11 is substantially constant everywhere on its entire perimeter.

Each guard ring 11 is a p$^+$ type highly-concentrated region that is formed by implanting p type impurities in the epitaxial layer 8. In detail, two p type well regions 13 each of which is substantially square annular when viewed planarly and between which a gap lies are formed on the side of the obverse surface 9 of the epitaxial layer 8 (i.e., on the Si plane side) in a region outside the active region 10. The guard ring 11 that is substantially square annular when viewed planarly is formed in the surface layer part of each of the p type well regions 13.

Many p type body regions 12 are disposed in a matrix manner at a constant pitch in row-wise and column-wise directions on the side of the obverse surface 9 of the epitaxial layer 8 (i.e., on the Si plane side) in the active region 10. Each body region 12 is, for example, square when viewed planarly, and has a length of, for example, about 7.2 μm in each of the up-down and right-left directions in the drawing sheet of FIG. 1B. Each body region 12 has a depth of, for example, about 0.65 μm. The p type impurity concentration of the body region 12 is, for example, $1\times10^{16}$ cm$^{-3}$ to $1\times10^{17}$ cm$^{-3}$ ($1\times10^{17}$ cm$^{-3}$ or less). This low impurity concentration contributes to the realization of a device having high carrier mobility.

For example, the p type impurity may be Al. On the other hand, a region in the epitaxial layer 8 that is closer to the SiC substrate 5 (the C plane) than to the body region 12 is used as an n$^-$ type drift region 14 that maintains a state without any change after the end of epitaxial growth.

A p$^+$ type body contact region 15 is formed at the middle of a surface layer part of each body region 12, and an n$^+$ type source region 16 is formed so as to surround the body contact region 15. The body contact region 15 is square when viewed planarly, and has a length of, for example, about 1.6 μm in each of the up-down and right-left directions in the drawing sheet of FIG. 1B. The body contact region 15 has a depth of, for example, about 0.35 μm.

The n$^+$ type source region 16 is square annular when viewed planarly, and has a length of, for example, about 5.7 μm in each of the up-down and right-left directions in the drawing sheet of FIG. 1B. The source region 16 has a depth of, for example, about 0.25 μm. The n type impurity concentration of the source region 16 is $1\times10^{19}$ cm$^{-3}$ or more, and, preferably, $1\times10^{20}$ cm$^{-3}$ or more. More specifically, the n type impurity concentration of the source region 16 may be $1\times10^{19}$ cm$^{-3}$ to $1\times10^{22}$ cm$^{-3}$, and, more preferably, $1\times10^{20}$ cm$^{-3}$ to $1\times10^{21}$ cm$^{-3}$. The n type impurity may be P (phosphorus).

In the active region 10, each region between the body regions 12 arranged in a matrix manner at a constant pitch (i.e., each body-to-body region 17 sandwiched between the side surfaces of the adjoining body regions 12) is arranged in a lattice-like manner having a constant width (e.g., 2.8 μm).

A lattice-like gate insulating film 19 (not shown in FIG. 1B) is formed on the obverse surface 9 of the epitaxial layer 8 in a region excluding both the body contact region 15 and a region surrounding the body contact region 15. The gate insulating film 19 may be made of an oxide film (e.g., silicon oxide film) or may be made of an oxide film containing nitrogen (e.g., silicon oxide nitride film).

A gate electrode 20 is formed on the gate insulating film 19 at a place substantially corresponding to the body-to-body region 17. The gate electrode 20 is formed in a lattice-like manner along the lattice-like gate insulating film 19. The gate electrode 20 faces the epitaxial layer 8 excluding the body regions 12 with the gate insulating film 19 therebetween, and faces a region straddling the body region 12 and the source region 16 with the gate insulating film 19 therebetween. Therefore, the gate electrode 20 overlaps with the source region 16 when viewed planarly.

Additionally, a first p type region 31 of a gate protection diode 30 is formed on the gate insulating film 19 so as to surround the gate electrode 20 when viewed planarly. In the present embodiment, the gate electrode 20 and the first p type region 31 are formed integrally with each other. In other words, the outer peripheral edge of the gate electrode 20 is connected to the first p type region 31. The first p type region 31 is formed along the inner p type well region 13 so as to be substantially square annular when viewed planarly. The first p type region 31 faces an inner peripheral edge of the inner p type well region 13, the epitaxial layer 8 between the inner p type well region 13 and the outermost body region 12, and a region straddling the outermost body region 12 and its source region 16 with the gate insulating film 19 therebetween in a cross section shown in FIG. 2. The gate electrode 20 and the first p type region 31 are made of, for example, polysilicon, and are doped with highly-concentrated p type impurities.

The gate electrode 20 and the first p type region 31 are, for example, about 6000 Å in thickness.

As shown in FIG. 1B, the gate protection diode 30 that is substantially square annular when viewed planarly and that includes the first p type region 31 is formed on the gate insulating film 19 in a region substantially corresponding to the inner p type well region 13. The gate protection diode 30 includes the first p type region 31 that is substantially square annular when viewed planarly, an n type region 32 that is substantially square annular when viewed planarly and that is formed around the first p type region 31, and a second p type region 33 that is substantially square annular when viewed planarly and that is formed around the n type region 32. The second p-type region 33 faces the inner guard ring 11 with the gate insulating film 19 therebetween, and faces the inner p type well region 13 with the gate insulating film 19 therebetween. The n type region 32 faces the inner p type well region 13 with the gate insulating film 19 therebetween. The n type region 32 and the second p type region 33 are equal in thickness to the first p type region 31 (i.e., to the gate electrode 20).

A first diode 30A is formed of the first p type region 31 and the n type region 32, whereas a second diode 30B is formed of the n type region 32 and the second p type region 33. The second p type region 33 is made of, for example, polysilicon, and is doped with highly-concentrated p type impurities in the same way as the first p type region 31. The n type region 32 is made of, for example, polysilicon, and is doped with highly-concentrated n type impurities. The width of the first p type region 31 may be about 1 μm to 10 μm. The width of the n type region 32 may be about 1 μm to 10 μm. The width of the second p type region 33 may be about 1 μm to 10 μm.

In the semiconductor device 1, the boundary between unit cells is set at the center in the width direction of the body-to-body region 17. Each unit cell has a length of, for example, about 10 μm in each of the up-down and right-left directions in the drawing sheet of FIG. 1B. In each unit cell, an annular channel is formed at the peripheral edge of the body region 12 of each unit cell by controlling a voltage that is applied to the gate electrode 20 (e.g., by applying a voltage of 6 V or more). A drain current that flows toward the obverse surface 9 of the epitaxial layer 8 along four side surfaces of each body region 12 in the drift region 14 can be allowed to flow into the source region 16 through the annular channel. A channel length L is prescribed by the width of the body region 12 just under the gate electrode 20, and may be 0.3 μm or more (e.g., about 0.65 μm).

An interlayer insulating film 25 made of, for example, $SiO_2$ is stacked on the epitaxial layer 8 so as to cover an exposed surface of the gate electrode 20, an exposed surface of the first p type region 31, an exposed surface of the n type region 32, and an inner peripheral edge in the upper surface of the second p type region 33. A contact hole 26 is formed in the interlayer insulating film 25. The central part of the source region 16 and the whole of the body contact region 15 are exposed in the contact hole 26.

A source electrode 27 is formed on the interlayer insulating film 25. The source electrode 27 is collectively brought into contact with the source regions 16 and the body contact regions 15 of all unit cells through each contact hole 26. In other words, the source electrode 27 is a shared wire with respect to all unit cells. The source electrode 27 is also brought into contact with the upper surface of the second p type region 33 of the gate protection diode 30. Therefore, the first p type region 31 of the gate protection diode 30 is electrically connected to the gate electrode 20, and the second p type region 33 is electrically connected to the source electrode 27. In other words, the gate protection diode 30 is connected between gates and sources of all unit cells.

An interlayer insulating film (not shown) is formed on the source electrode 27, and, through this interlayer insulating film (not shown), the source electrode 27 is electrically connected to the source pad 2 (see FIG. 1A). On the other hand, the gate pad 4 (see FIG. 1A) is electrically connected to the gate electrode 20 through a gate wire (not shown) laid on the aforementioned interlayer insulating film (not shown).

The source electrode 27 may have a structure in which a Ti/TiN layer 28 and an Al layer 29 are stacked in order from the contact side with the epitaxial layer 8. The Ti/TiN layer 28 is a laminated film in which a Ti layer serving as an adhesion layer is provided on the side of the epitaxial layer 8, and a TiN layer serving as a barrier layer is stacked on the Ti layer. The barrier layer prevents the constituent atoms (Al atoms) of the Al layer 29 from diffusing toward the epitaxial layer 8.

A drain electrode 40 is formed on the reverse surface 7 of the SiC substrate 5 so as to cover its whole area. This drain electrode 40 is a shared electrode with respect to all unit cells. For example, a laminated structure (Ti/Ni/Au/Ag) in which Ti, Ni, Au, and Ag are stacked in order from the side of the SiC substrate 5 can be employed as the drain electrode 40.

Figure 2:
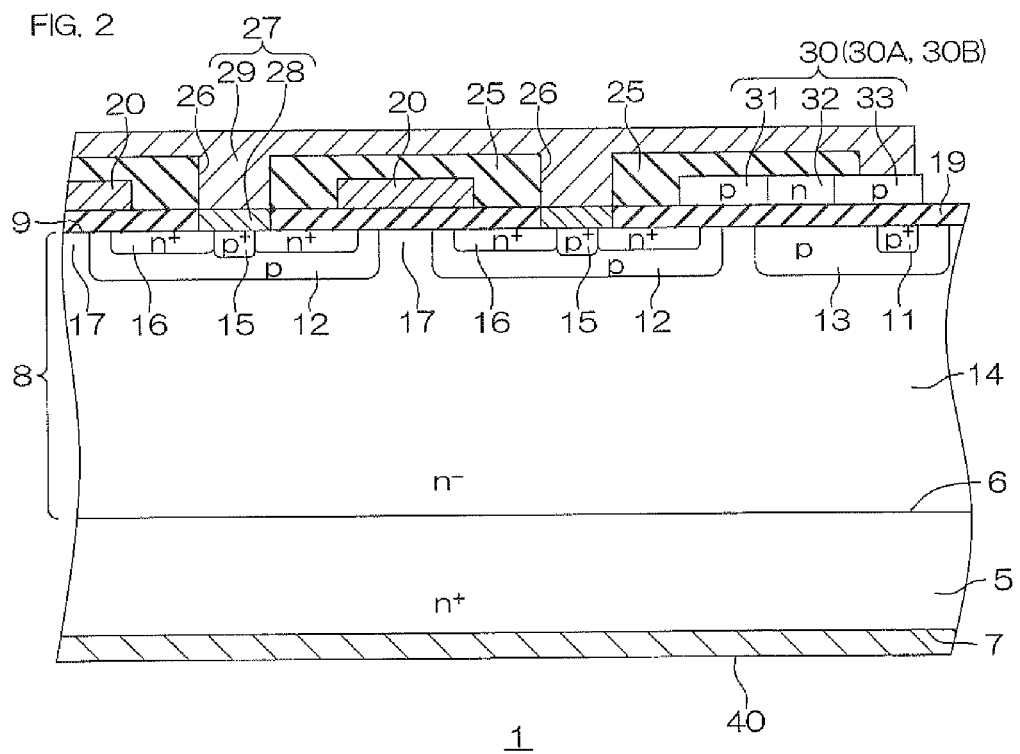
FIG. 2 is a sectional view showing a cutting plane along the cutting-plane line II-II of FIG. 1B.
Figure 3:
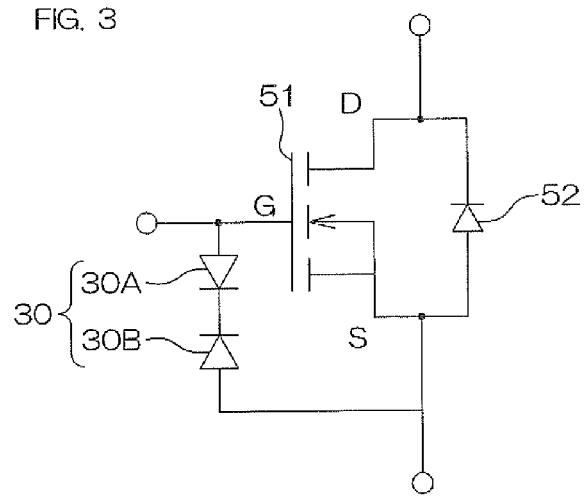
FIG. 3 is an electric circuit diagram of the semiconductor device shown in FIG. 1A, FIG. 1B, and FIG. 2.

FIG. 3 is an electric circuit diagram of the semiconductor device shown in FIG. 1.

The semiconductor device 1 is composed of a MOSFET 51 and the gate protection diode 30 connected between the source S (source electrode 27) and the gate G (gate electrode 20) of the MOSFET 51. A parasitic diode 52 is connected between the source S (source electrode 27) and the drain D (drain electrode 40) of a MOSFET 41. The parasitic diode 52 is formed of the p type body region 12, the $n^-$ type drift region 14, and the $n^+$ type substrate 5 that are disposed between the source electrode 27 and the drain electrode 40 of the MOSFET 41.

The gate protection diode 30 includes a first diode 30A and a second diode 30B that are connected in anti-series to each other. An anode of the first diode 30A is connected to the gate G of the MOSFET 51. A cathode of the first diode 30A is connected to a cathode of the second diode 30B. An anode of the second diode 30B is connected to the source S of the MOSFET 51.

A reverse breakdown voltage of the first diode 30A is represented as $V_{BR1}$ ($V_{BR1}>0$), whereas a reverse breakdown voltage of the second diode 30B is represented as $V_{BR2}$ ($V_{BR2}>0$). When a reverse voltage greater than the reverse breakdown voltage $V_{BR1}$ is applied to the first diode 30A, the first diode 30A breaks down. In other words, the first diode 30A has a function to limit a reverse voltage that is applied thereto to the reverse breakdown voltage $V_{BR1}$ or less. Therefore, when the source potential is set at 0 V, the first diode 30A limits a voltage that is applied between the source S and the gate G of the MOSFET 51 to a value in which a negative sign is given to the reverse breakdown voltage $V_{BR1}$ (hereinafter, referred to as "negative second limited voltage $-V_{BR1}$") or more.

When a reverse voltage greater than the reverse breakdown voltage $V_{BR2}$ is applied to the second diode 30B, the second diode 30B breaks down. In other words, the second diode 30B has a function to limit a reverse voltage that is applied thereto to the reverse breakdown voltage $V_{BR2}$ or less. Therefore, when the source potential is set at 0 V, the second diode 30B limits a voltage that is applied between the source S and the gate G of the MOSFET 51 to its reverse breakdown voltage $V_{BR2}$ (hereinafter, referred to as "positive first limited voltage $V_{BR2}$") or less. Therefore, the gate protection diode 30 limits a voltage that is applied between the source S and the gate G of the MOSFET 41 to a voltage between the negative second limited voltage ($-V_{BR1}$) and the positive first limited voltage $V_{BR2}$.

The first diode 30A is designed so as to limit a negative voltage that is applied between the gate G and the source S to a voltage greater than a negative voltage in which the gate threshold value of the MOSFET 51 varies greatly. In other words, the first diode 30A is designed so that a value obtained by giving a negative sign to its reverse breakdown voltage $V_{BR1}$ (i.e., negative second limited voltage $-V_{BR1}$) becomes a value greater than the aforementioned negative voltage in which the gate threshold value of the MOSFET 51 varies greatly. More specifically, the first diode 30A is designed so that a value obtained by giving a negative sign to its reverse breakdown voltage $V_{BR1}$ (i.e., negative second limited voltage $-V_{BR1}$) becomes $-7$ V or more (e.g., $-7$ V).

The second diode 30B is designed so that its reverse breakdown voltage (positive first limited voltage $V_{BR2}$) becomes greater than a threshold voltage for electrical conduction between the drain D and the source S of the MOSFET 51, and becomes smaller than the withstand voltage of the gate insulating film (see FIG. 2). The threshold voltage for electrical conduction between the drain D and the source S of the MOSFET 51 is about 1 V to 5 V. The withstand voltage of the gate insulating film 19 is 10 MV/cm, and is about 40 V when the thickness of the gate insulating film 19 is, for example, 40 nm.

More preferably, the second diode 30B is designed so as to limit a positive voltage that is applied between the source S and the gate G of the MOSFET 51 to a voltage smaller than a positive voltage in which the gate threshold value of the MOSFET 51 varies greatly. In other words, the second diode 30B is designed so that its reverse breakdown voltage (positive first limited voltage $V_{BR2}$) becomes a value smaller than the aforementioned positive voltage in which the gate threshold value of the MOSFET 51 varies greatly. More specifically, the second diode 30B is designed so that the reverse breakdown voltage (positive first limited voltage $V_{BR2}$) becomes 20 V or more, and becomes 33 V or less (e.g., 33 V).

The second diode 30B is designed so that the positive first limited voltage $V_{BR2}$ becomes greater than the threshold voltage for electrical conduction between the drain D and the source S of the MOSFET 51, and therefore electrical conduction between the drain D and the source S of the MOSFET 51 can be performed by applying a predetermined gate voltage smaller than the positive first limited voltage $V_{BR2}$ between the gate G and the source S. Additionally, the second diode 30B is designed so that the positive first limited voltage $V_{BR2}$ becomes smaller than the withstand voltage of the gate insulating film 19, and therefore the gate insulating film 19 can be prevented from being destroyed.

Additionally, the first diode 30A is designed so that the negative second limited voltage $-V_{BR1}$ becomes a value greater than a negative gate-to-source voltage in which the gate threshold value of the MOSFET 51 varies greatly, whereas the second diode 30B is designed so that the positive first limited voltage $V_{BR2}$ becomes a value smaller than a positive gate-to-source voltage in which the gate threshold value of the MOSFET 51 varies greatly. Therefore, the semiconductor device 1 can prevent a voltage in which the gate threshold value of the MOSFET 51 varies greatly from being applied between the source S and the gate G of the MOSFET 51. As a result, the gate threshold value of the MOSFET 51 can be restrained or prevented from varying. This makes it possible to avoid the fact that the MOSFET 51 is not turned on even if a voltage greater than the threshold value is applied to the gate or to avoid the fact that the MOSFET 51 is turned on when a voltage greater than the threshold value is not applied to the gate.

FIG. 4A, FIG. 4B, FIG. 5A, and FIG. 5B show results of an experiment in which a sample of a semiconductor device (comparative example) that does not have the gate protection diode 30 in spite of including a MOSFET identical in structure to the aforementioned semiconductor device 1 is created, and two kinds of negative voltages are applied between the gate and the source of the sample, and time-dependent variations in threshold voltage $V_{th}$ and in the amount of variation $\Delta V_{th}$ of the threshold voltage are examined. The amount of variation $\Delta V_{th}$ of the threshold voltage is the one that is based on a threshold voltage prior to the application of a voltage. The applied voltage $V_{ds}$ between the drain and the source of the MOSFET is 1 V, and the electric current $I_{ds}$ between the drain and the source of the MOSFET is 1 mA. The atmosphere temperature is 150° C.

Figure 4A:
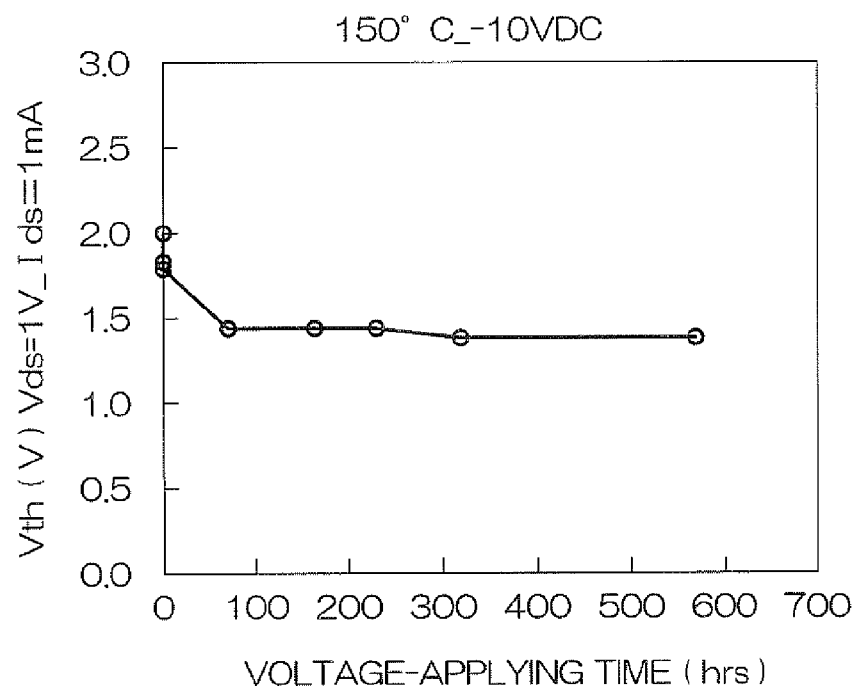
FIG. 4A and FIG. 4B show results of an experiment in which a sample of a semiconductor device that does not have a gate protection diode in spite of including a MOSFET identical in structure to the semiconductor device shown in FIGS. 1A, 1B, and 2 is created, and a voltage of −10 V is applied between the gate and the source of the sample, and time-dependent variations in threshold voltage $V_{th}$ and in the amount of variation $\Delta V_{th}$ of the threshold voltage are examined.
Figure 4B:
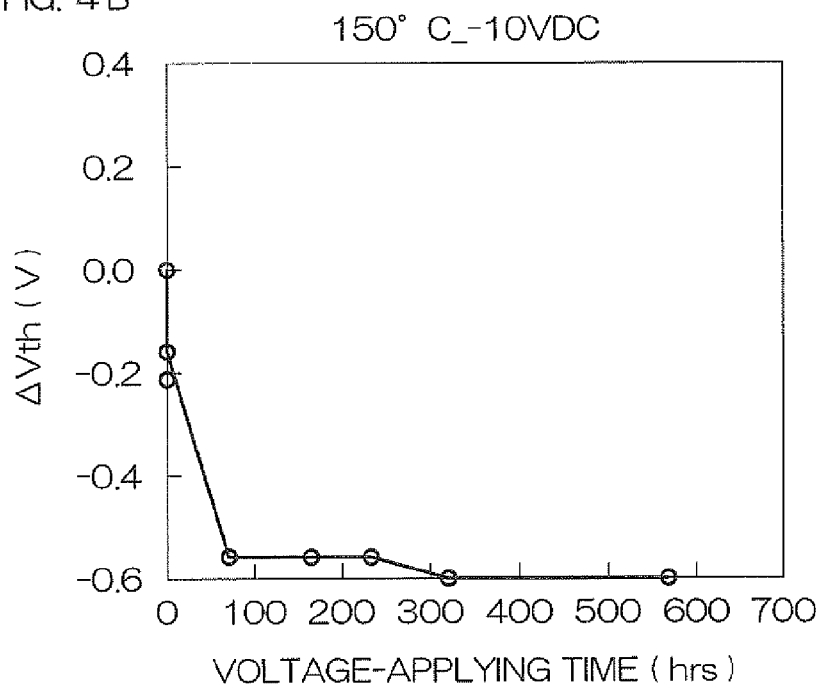
Figure 5A:
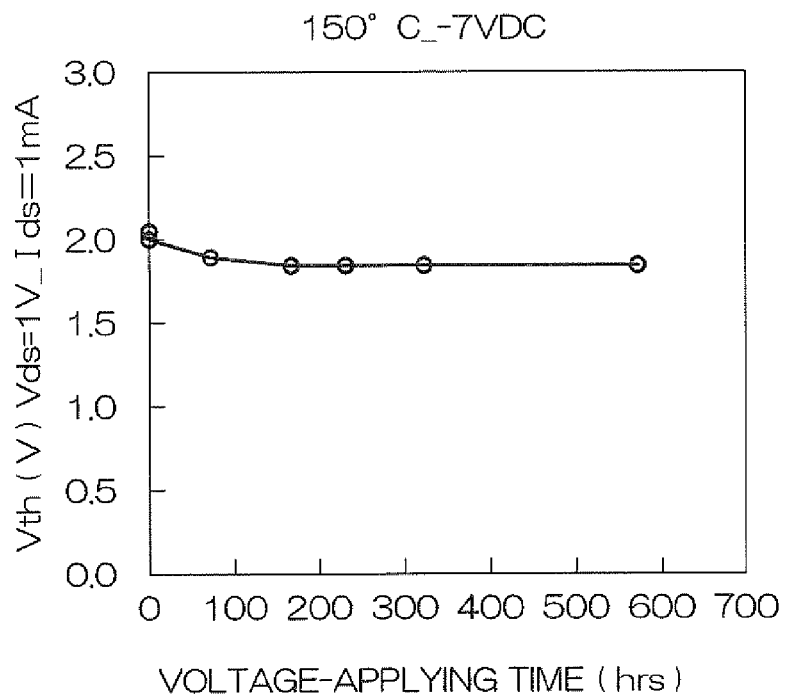
FIG. 5A and FIG. 5B show results of an experiment in which a sample of a semiconductor device that does not have a gate protection diode in spite of including a MOSFET identical in structure to the semiconductor device shown in FIGS. 1A, 1B, and 2 is created, and a voltage of −7 V is applied between the gate and the source of the sample, and time-dependent variations in threshold voltage $V_{th}$ and in the amount of variation $\Delta V_{th}$ of the threshold voltage are examined.
Figure 5B:
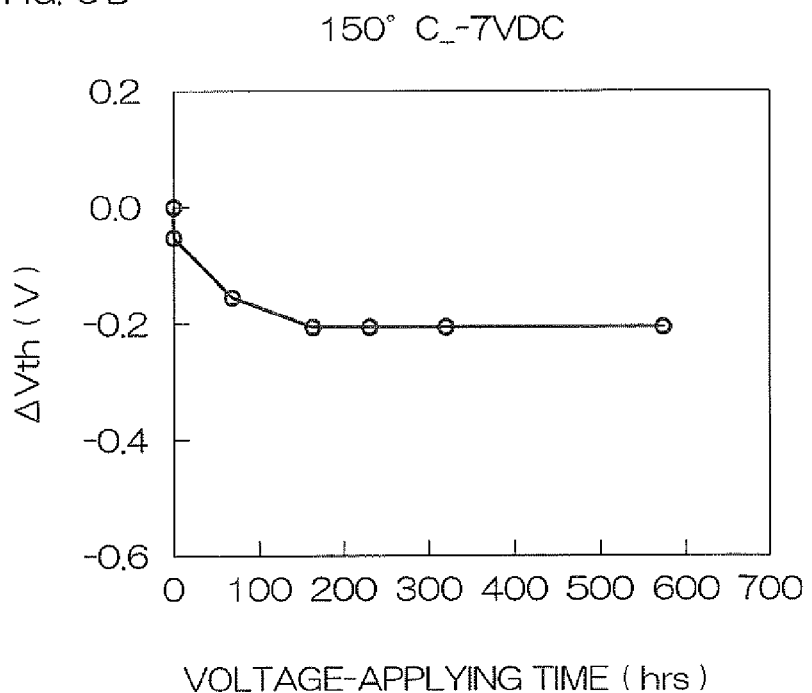

FIG. 4A and FIG. 4B show experimental results when a negative voltage of $-10$ V is applied between the gate and the source of the sample, and FIG. 5A and FIG. 5B show experimental results when a negative voltage of $-7$ V is applied between the gate and the source of the sample. When a negative voltage is applied between the drain and the source of the MOSFET, holes are injected into the gate insulating film, and therefore the threshold voltage $V_{th}$ falls along with the passage of time until a fixed time elapses. After that, the threshold voltage $V_{th}$ becomes substantially constant. The threshold voltage $V_{th}$ prior to the application of a voltage is about 2.0 V.

When a negative voltage of $-10$ V is applied between the gate and the source of the sample, the threshold voltage $V_{th}$ becomes about 1.4 V, and the amount of variation $\Delta V_{th}$ thereof becomes $-0.5$ V or more at a time point at which 100 hours have elapsed after the voltage application as shown in FIG. 4A and FIG. 4B. In other words, the threshold voltage $V_{th}$ falls greatly. On the other hand, when a negative voltage of $-7$ V is applied between the gate and the source of the sample, the threshold voltage $V_{th}$ becomes about 1.8 V, and the amount of variation $\Delta V_{th}$ thereof becomes $-0.2$ V at a time point at which 200 hours have elapsed after the voltage application as shown in FIG. 5A and FIG. 5B. After that, the threshold voltage $V_{th}$ hardly varies. In other words, when the applied voltage between the gate and the source is $-7$ V, the threshold voltage $V_{th}$ does not fall greatly.

From these experimental results, it is understood that a great variation in the threshold voltage $V_{th}$ can be restrained or prevented if the negative applied voltage between the gate and the source is limited to $-7$ V or more. Therefore, in the semiconductor device 1 according to the present embodiment, it is understood that a great variation in the threshold voltage $V_{th}$ can be restrained or prevented if the negative first limited voltage $-V_{BR1}$ is set at $-7$ V or more.

Figure 6:
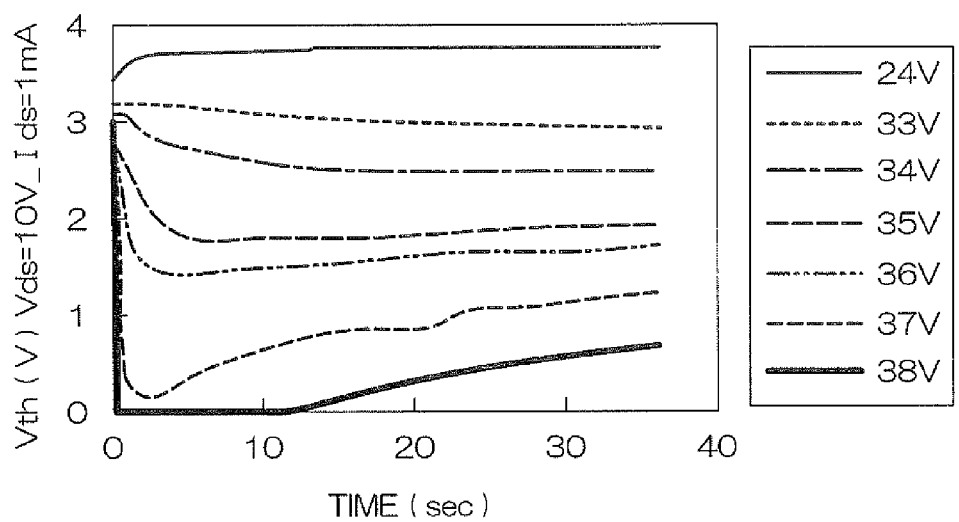
FIG. 6 shows a result of an experiment in which a sample of a semiconductor device that does not have a gate protection diode in spite of including a MOSFET identical in structure to the semiconductor device shown in FIGS. 1A, 1B, and 2 is created, and a plurality of kinds of positive voltages are applied between the gate and the source of the sample, and time-dependent variations in the threshold voltage $V_{th}$ are examined.

FIG. 6 shows a result of an experiment in which a sample of a semiconductor device (comparative example) that does not have the gate protection diode 30 in spite of including a MOSFET identical in structure to the aforementioned semiconductor device 1 is created, and a plurality of kinds of positive voltages are applied between the gate and the source of the sample, and time-dependent variations in the threshold voltage $V_{th}$ are examined. The applied voltage $V_{ds}$ between the drain and the source of the MOSFET is 1 V, and the electric current $I_{ds}$ between the drain and the source of the MOSFET is 1 mA. The atmosphere temperature is 150° C. The kinds of voltages applied between the gate and the source are seven kinds, i.e., 24 V, 33 V, 34 V, 35 V, 36 V, 37 V, and 38 V.

When a positive voltage is applied between the drain and the source of the MOSFET 51, both the hole and the electron are injected into the gate insulating film 19. In this case, the hole is more easily injected at the beginning, and therefore the threshold voltage $V_{th}$ falls. As is understood from FIG. 6, the threshold voltage $V_{th}$ falls more rapidly and more greatly in proportion to an increase in the applied voltage between the gate and the source. Thereafter, the injection of electrons proceeds, and therefore the threshold voltage $V_{th}$ rises gradually.

When the applied voltage between the gate and the source is 34 V, the threshold voltage $V_{th}$ undergoes a fall of about 0.5 V at a time point at which 20 hours or more have elapsed. If the applied voltage between the gate and the source is greater than 34 V, the amount of variation of the threshold voltage $V_{th}$ becomes greater than when the applied voltage between the gate and the source is 34 V. When the applied voltage between the gate and the source is 33 V, the threshold voltage $V_{th}$ varies only slightly even if 20 hours or more have elapsed.

From this experimental result, it is understood that a great variation in the threshold voltage $V_{th}$ can be restrained or prevented if the positive applied voltage between the gate and the source is limited to 33 V or less. Therefore, in the semiconductor device 1 according to the present embodiment, it is understood that a great variation in the threshold voltage $V_{th}$ can be restrained or prevented if the second positive limited voltage $V_{BR2}$ is set at 33 V or less.

FIG. 7A to FIG. 7K are schematic sectional views to describe a method for manufacturing the semiconductor device 1.

Figure 7A:
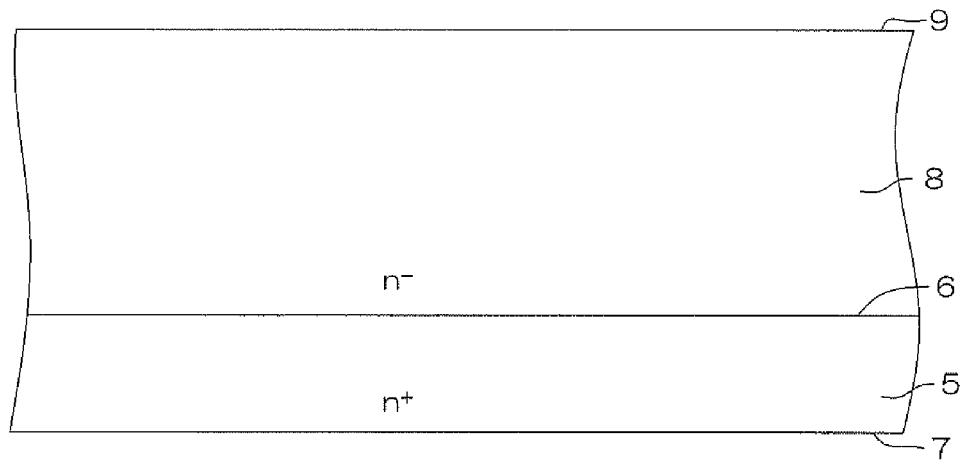
FIG. 7A is a schematic sectional view to describe a method for manufacturing the semiconductor device shown in FIG. 1A, FIG. 1B, and FIG. 2.

In order to manufacture the semiconductor device 1, SiC crystals are first grown while providing an n type impurity (e.g., N (nitrogen)) onto the obverse surface (Si plane) 6 of the SiC substrate 5, as shown in FIG. 7A, according to an epitaxial growth method, such as a CVD (Chemical Vapor Deposition) method, an LPE (Liquid Phase Epitaxy) method, or an MBE (Molecular Beam Epitaxy) method. As a result, an n⁻ type epitaxial layer 8 is formed on the SiC substrate 5. The concentration of the n type impurity is, for example, $1 \times 10^{15}$ cm⁻³ to $1 \times 10^{16}$ cm⁻³.

Figure 7B:
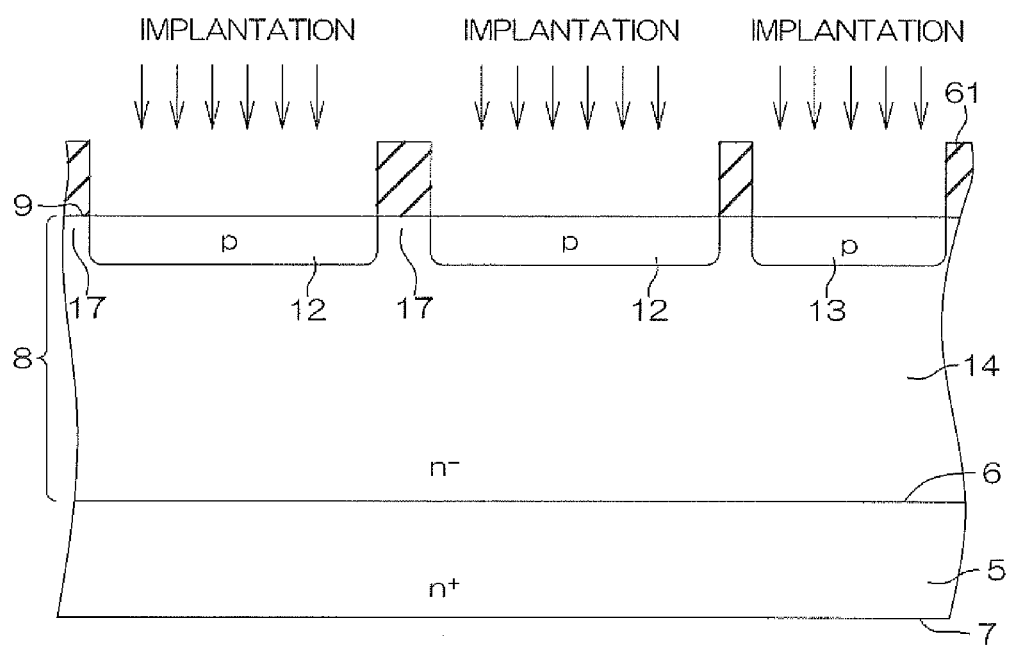
FIG. 7B is a sectional view showing a step subsequent to that of FIG. 7A.

Thereafter, as shown in FIG. 7B, a p type impurity (e.g., Al (aluminum)) is implanted into the epitaxial layer 8 from the obverse surface 9 of the epitaxial layer 8 by use of an $SiO_2$ mask 61 that has an opening at a part at which the body region 12 and the p type well region 13 are to be formed. The implantation condition at this time may be that, for example, the dose amount is about $6 \times 10^{13}$ cm⁻² and the acceleration energy is about 380 keV, although it depends on the kind of the p type impurity. As a result, the body region 12 and the p type well region 13 are formed in the surface layer part of the epitaxial layer 8. The p type impurity concentration of the body region 12 and that of the p type well region 13 are set to be, for example, $1 \times 10^{16}$ cm⁻³ to $1 \times 10^{17}$ cm⁻³ ($1 \times 10^{17}$ cm⁻³ or less). The drift region 14 that maintains a state without any change after the end of epitaxial growth is formed in the base part of the epitaxial layer 8.

Figure 7C:
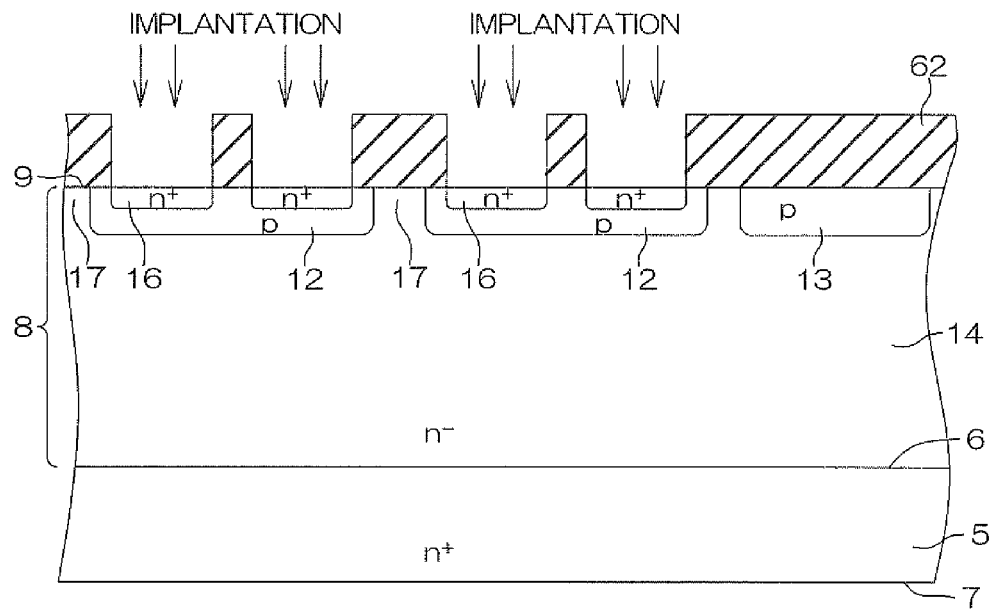
FIG. 7C is a sectional view showing a step subsequent to that of FIG. 7B.

Thereafter, as shown in FIG. 7C, an n type impurity (e.g., P (phosphorus)) is implanted into the epitaxial layer 8 from the obverse surface 9 of the epitaxial layer 8 by use of an $SiO_2$ mask 62 that has an opening in a region in which the source region 16 is to be formed. More specifically, multistage (e.g., four-stage) ion implantation may be performed while the epitaxial layer 8 is being kept at, for example, room temperature on the condition that, for example, the dose amount falls within $2.0 \times 10^{13}$ cm⁻² to $1.0 \times 10^{14}$ cm⁻² and the acceleration energy falls within the range of 30 keV to 160 keV, although it depends on the kind of the n type impurity. The n type impurity concentration of the source region 16 is set to be, for example, $1 \times 10^{19}$ cm⁻³ to $1 \times 10^{22}$ cm⁻³, and, more preferably, $1 \times 10^{23}$ cm⁻³ to $1 \times 10^{21}$ =⁻³.

Figure 7D:
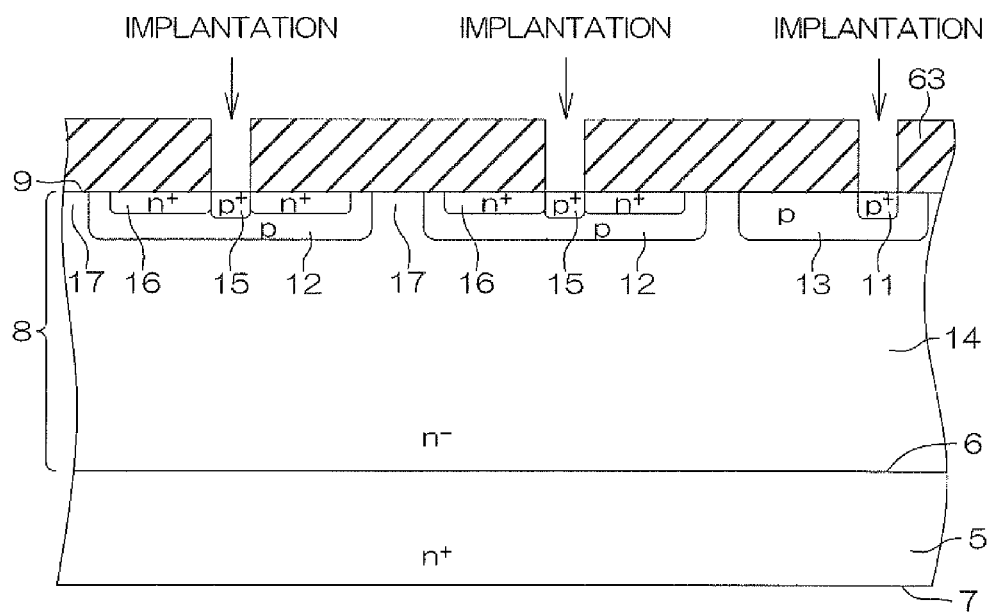
FIG. 7D is a sectional view showing a step subsequent to that of FIG. 7C.
Figure 7:
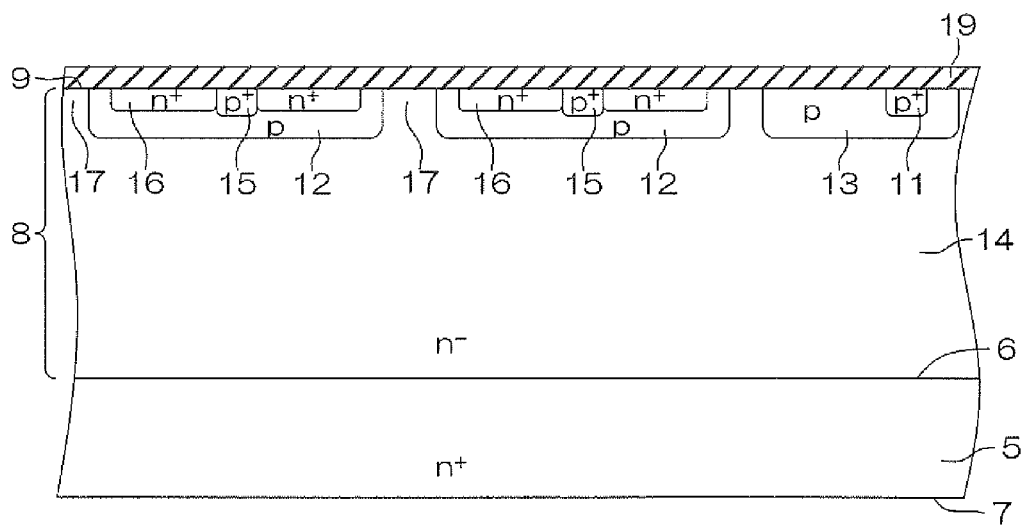
FIG. 7E is a sectional view showing a step subsequent to that of FIG. 7D.
FIG. 7F is a sectional view showing a step subsequent to that of FIG. 7E.
FIG. 7G is a sectional view showing a step subsequent to that of FIG. 7F.
FIG. 7H is a sectional view showing a step subsequent to that of FIG. 7G.
FIG. 7I is a sectional view showing a step subsequent to that of FIG. 7H.
FIG. 7J is a sectional view showing a step subsequent to that of FIG. 7I.
FIG. 7K is a sectional view showing a step subsequent to that of FIG. 7J.
Figure 7:
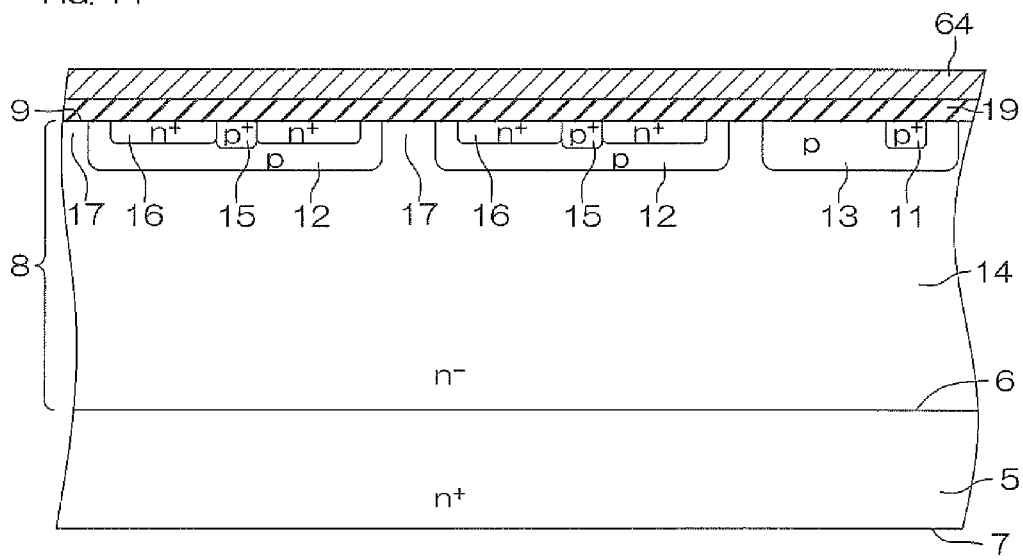

Thereafter, as shown in FIG. 7D, a p type impurity (e.g., Al) is implanted into the epitaxial layer 8 from the obverse surface 9 of the epitaxial layer 8 by use of an $SiO_2$ mask 63 that has an opening in a region in which the body contact region 15 and the guard ring 11 are to be formed. More specifically, multistage implantation (four-stage implantation) may be performed on the condition that, for example, the dose amount is about $3.7 \times 10^{15}$ cm⁻² and the acceleration energy falls within the range of 30 keV to 180 keV, although it depends on the kind of the p type impurity. As a result, the body contact region 15 and the guard ring 11 are formed.

Thereafter, the epitaxial layer 8 undergoes annealing treatment (heat treatment), for example, at 1400° C. to 2000° C. for 2 to 10 minutes. As a result, ions of the n type impurity and those of the p type impurity implanted into the surface layer part of the epitaxial layer 8 are activated. The annealing treatment of the epitaxial layer 8 can be performed by controlling a heating furnace, such as a resistance heating furnace or a high frequency induction heating furnace, at a suitable temperature.

Thereafter, as shown in FIG. 7E, the obverse surface 9 of the epitaxial layer 8 is thermally oxidized, and, as a result, the gate insulating film 19 with which the whole area of the obverse surface 9 of the epitaxial layer 8 is covered is formed. More specifically, the gate insulating film 19 made of a silicon oxide nitride film may be formed by thermal oxidation in an atmosphere that contains nitrogen and oxygen (e.g., at about 1100° C. to 1400° C. for a half day to two days).

Thereafter, as shown in FIG. 7F, a polysilicon material 64 is deposited on the epitaxial layer 8 according to the CVD method.

Figure 7G:
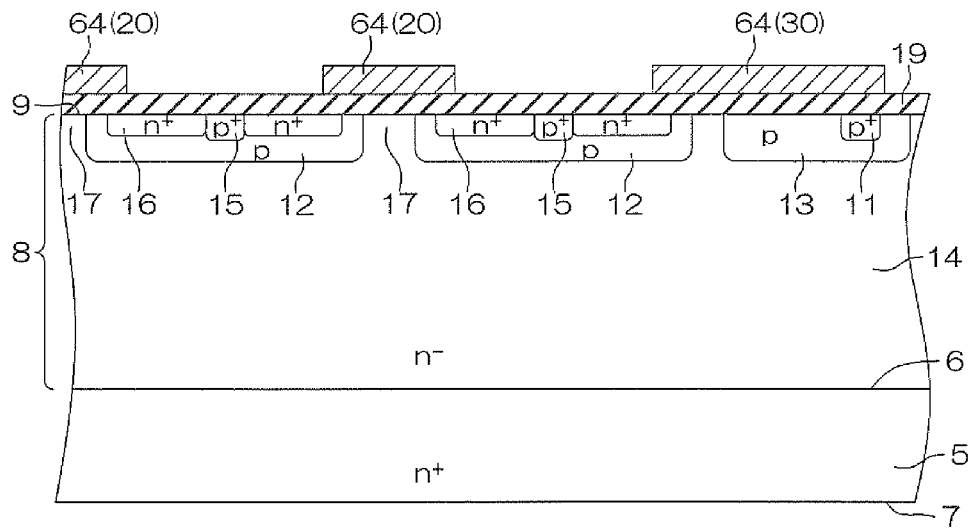

Thereafter, as shown in FIG. 7G, a needless part (i.e., a part excluding a region in which the gate electrode 20 and the gate protection diode 30 are to be formed) of the polysilicon material 64 deposited thereon is removed by dry etching. As a result, the region of the polysilicon material 64 in which the gate electrode 20 and the gate protection diode 30 are to be formed is left.

Figure 7H:
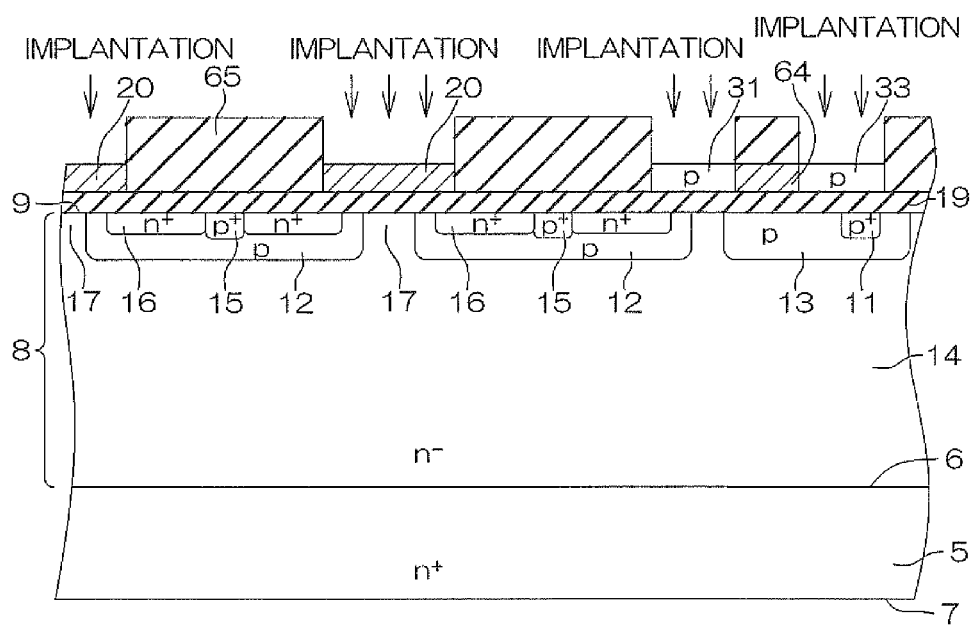

Thereafter, as shown in FIG. 7H, a p type impurity (e.g., B (boron)) is implanted into the polysilicon material 64 by use of an $SiO_2$ mask 65 that has an opening in a region in which the gate electrode 20 and the first and second p type regions 31 and 33 of the gate protection diode 30 are to be formed. As a result, the gate electrode 20 and the first and second p type regions 31 and 33 of the gate protection diode 30 are formed.

Thereafter, as shown in FIG. 7I, an n type impurity (e.g., P (phosphorus)) is implanted into the polysilicon material 64 by use of an $SiO_2$ mask 66 that has an opening in which the n type region 32 of the gate protection diode 30 is to be formed. As a result, the n type region 32 of the gate protection diode 30 is formed. As a result, the gate protection diode 30 including the first p type region 31, the n type region 32, and the second p type region 33 is formed. As described above, the first diode 30A is formed of the first p type region 31 and the n type region 32, whereas the second diode 30B is formed of the n type region 32 and the second p type region 33.

Thereafter, as shown in FIG. 7J, the interlayer insulating film 25 made of $SiO_2$ is stacked on the epitaxial layer 8 according to the CVD method.

Thereafter, as shown in FIG. 7K, the interlayer insulating film 25 and the gate insulating film 19 successively undergo patterning, and, as a result, the contact hole 26 is formed.

Thereafter, for example, Ti, TiN, and Al are spattered on the interlayer insulating film 25 in this order, and the source electrode 27 is formed. Furthermore, for example, Ti, Ni, Au, and Ag are spattered on the reverse surface 7 of the SiC substrate 5 in this order, and the drain electrode 40 is formed.

Thereafter, an interlayer insulating film (not shown), the source pad 2, the gate pad 4, etc., are formed, and, as a result, the semiconductor device 1 shown in FIG. 1A, FIG. 1B, and FIG. 2 can be obtained.

Figure 8:
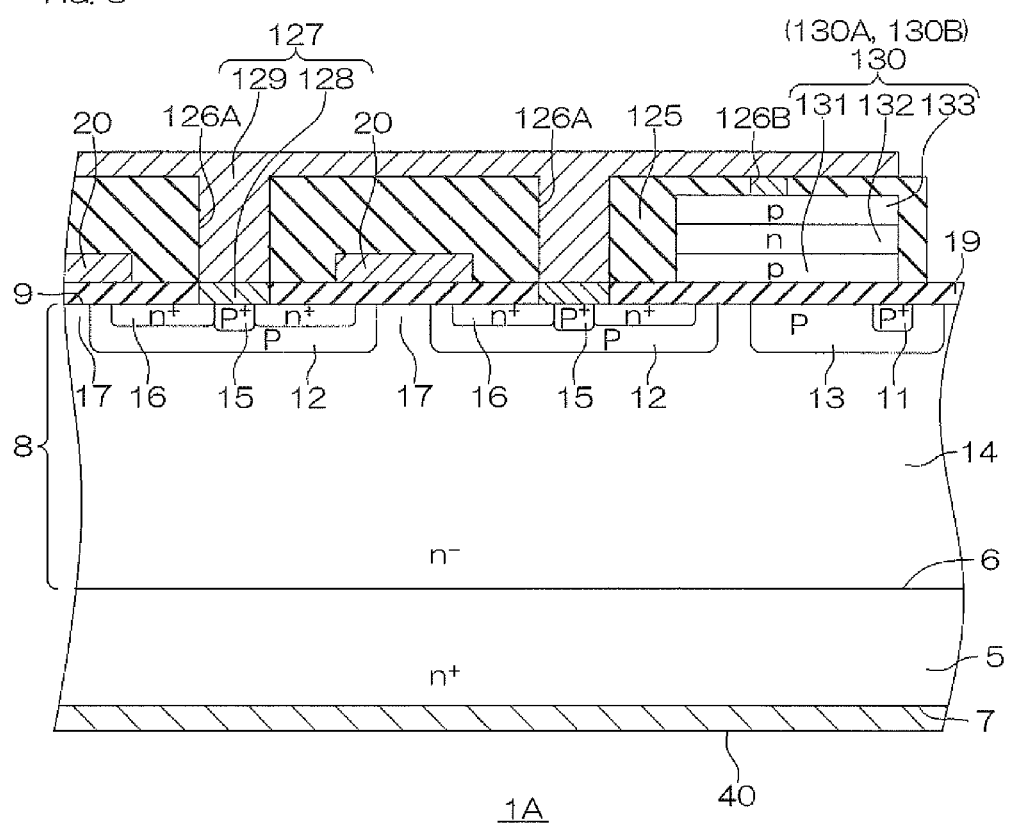
FIG. 8 is a schematic sectional view of a semiconductor device according to a second embodiment of the present invention.

FIG. 8 is a schematic sectional view of a semiconductor device according to a second embodiment of the present invention. The plan view of the semiconductor device according to the second embodiment is substantially the same as that of FIG. 1A and that of FIG. 1B. FIG. 8 is a sectional view corresponding to the sectional view of FIG. 2. In FIG. 8, the same reference sign as in FIG. 2 is given to a component equivalent to each component of FIG. 2.

The semiconductor device 1A differs in the structure of the gate protection diode from the semiconductor device 1 shown in FIG. 1A, FIG. 1B, and FIG. 2.

A lattice-like gate insulating film 19 is formed on the obverse surface 9 of the epitaxial layer 8 in a region excluding a part corresponding to the body contact region 15 and the surroundings region. A gate electrode 20 is formed on the gate insulating film 19 at a place substantially corresponding to the body-to-body region 17. The gate electrode 20 is formed in a lattice-like manner along the lattice-like gate insulating film 19. The gate electrode 20 faces the epitaxial layer 8 corresponding to the body-to-body region 17 with the gate insulating film 19 therebetween, and faces a region straddling the body region 12 and the source region 16 with the gate insulating film 19 therebetween. Therefore, the gate electrode 20 overlaps with the source region 16 when viewed planarly.

Additionally, a first p type region 131 of a gate protection diode 130 is formed on the gate insulating film 19 so as to surround the gate electrode 20 when viewed planarly. The gate electrode 20 and the first p type region 131 are formed integrally with each other. In other words, the outer end of the gate electrode 20 is connected to the first p type region 131. The first p type region 131 is formed along the inner p type well region 13 so as to be substantially square annular when viewed planarly. The first p type region 131 faces the inner guard ring 11, the inner p type well region 13, the epitaxial layer 8 between the inner p type well region 13 and the outermost body region 12, and a region straddling the outermost body region 12 and its source region 16 with the gate insulating film 19 therebetween in a cross section of FIG. 8. The gate electrode 20 and the first p type region 31 are made of, for example, polysilicon, and are doped with highly-concentrated p type impurities. The gate electrode 20 and the first p type region 31 are, for example, about 6000 Å in thickness.

An n type region 132 of the gate protection diode 130 is formed on the p type region 131 on its entire perimeter. The n type region 132 is made of, for example, polysilicon, and is doped with n type impurities. The n type region 131 is, for example, about 6000 Å in thickness.

A second p type region 133 of the gate protection diode 130 is formed on the n type region 132 on its entire perimeter. The second p type region 133 is made of, for example, polysilicon, and is doped with p type impurities. The second p type region 133 is, for example, about 6000 Å in thickness. The first p type region 131, the n type region 132, and the second p type region 133 are, for example, about 1 μm to 10 μm in width. The gate protection diode 130 is formed of the first p type region 131, the n type region 132, and the second p type region 133.

The first diode 131A is formed of the first p type region 131 and the n type region 132, whereas the second diode 131B is formed of the n type region 132 and the second p type region 133. The first diode 130A is designed so that a value obtained by giving a negative sign to its reverse breakdown voltage $V_{BR1}$ (i.e., negative second limited voltage $-V_{BR1}$) becomes −7 V or more (e.g., −7 V). The second diode 130B is designed so that its reverse breakdown voltage $V_{BR2}$ (positive first limited voltage) becomes 20 V or more, and becomes 33 V or less (e.g., 33 V).

In the semiconductor device 1A, the boundary between unit cells is set at the center in the width direction of the body-to-body region 17. In each unit cell, an annular channel is formed at the peripheral edge of the body region 12 of each unit cell by controlling a voltage that is applied to the gate electrode 20 (e.g., by applying a voltage of 6V or more). A drain current that flows toward the obverse surface 9 of the epitaxial layer 8 along four side surfaces of each body region 12 in the drift region 14 can be allowed to flow into the source region 16 through the annular channel.

An interlayer insulating film 125 made of, for example, $SiO_2$ is stacked on the epitaxial layer 8 so as to cover the gate electrode 20 and the gate protection diode 130. A first contact hole 126A and a second contact hole 126B are formed in the interlayer insulating film 125. The central part of the source region 16 and the whole of the body contact region 15 are exposed in the first contact hole 126A. A part of the second p type region 133 of the gate protection diode 130 is exposed in the second contact hole 126B.

A source electrode 127 is formed on the interlayer insulating film 125. The source electrode 127 may have a structure in which a Ti/TiN layer 128 and an Al layer 129 are stacked in order from the contact side with the epitaxial layer 8 and the second p type region 133. The source electrode 127 is collectively brought into contact with the source regions 16 and the body contact regions 15 of all unit cells through the first contact hole 126A. In other words, the source electrode 127 is a shared wire with respect to all unit cells. The source electrode 127 is also brought into contact with the second p type region 133 of the gate protection diode 130 through the second contact hole 126B. Therefore, the first p type region 131 of the gate protection diode 130 is electrically connected to the gate electrode 20, and the second p type region 133 is electrically connected to the source electrode 127. In other words, the gate protection diode 130 is connected between gates and sources of all unit cells.

FIG. 9A to FIG. 9I show a method for manufacturing the semiconductor device 1A.

FIG. 7A to FIG. 7E in the method for manufacturing the aforementioned semiconductor device 1 are shared in a method for manufacturing the semiconductor device 1A. Therefore, steps subsequent to the completion of the formation of the gate insulating film 19 on the obverse surface of the epitaxial layer 8 will be described.

Figure 9A:
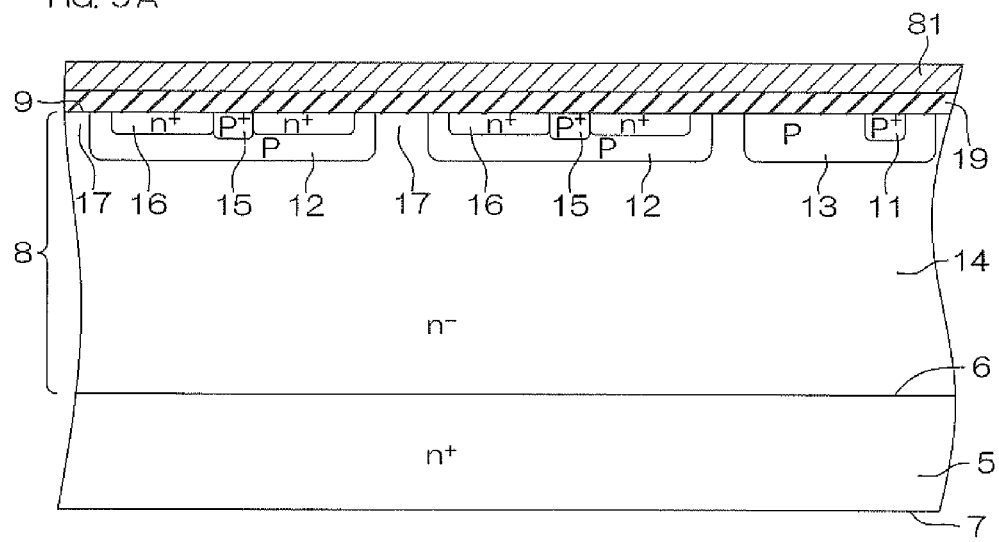
FIG. 9A is a schematic sectional view to describe a method for manufacturing the semiconductor device shown in FIG. 8.

When the gate insulating film 19 is formed on the obverse surface of the epitaxial layer 8, a polysilicon material 81 is deposited on the epitaxial layer 8 according to the CVD method as shown in FIG. 9A.

Figure 9B:
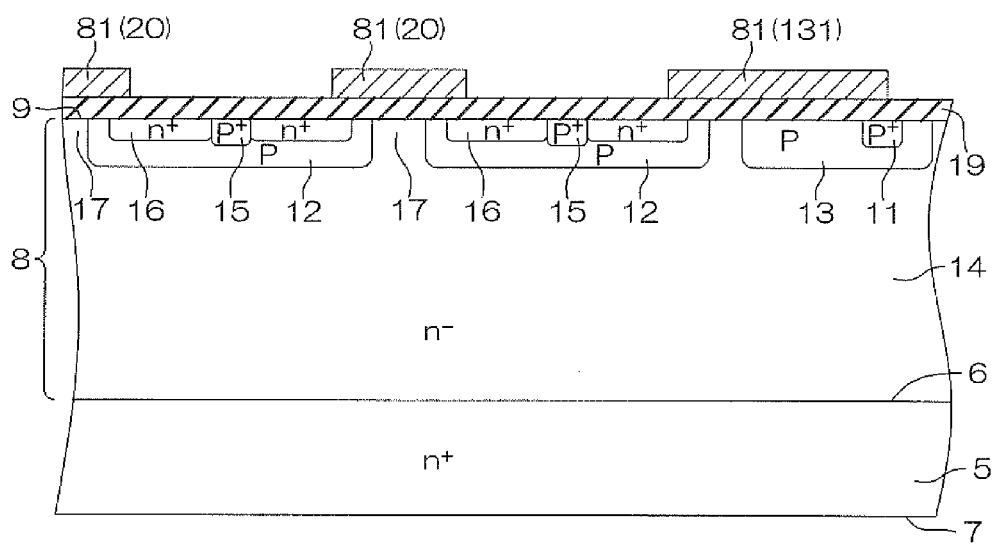
FIG. 9B is a sectional view showing a step subsequent to that of FIG. 9A.
Figure 9:
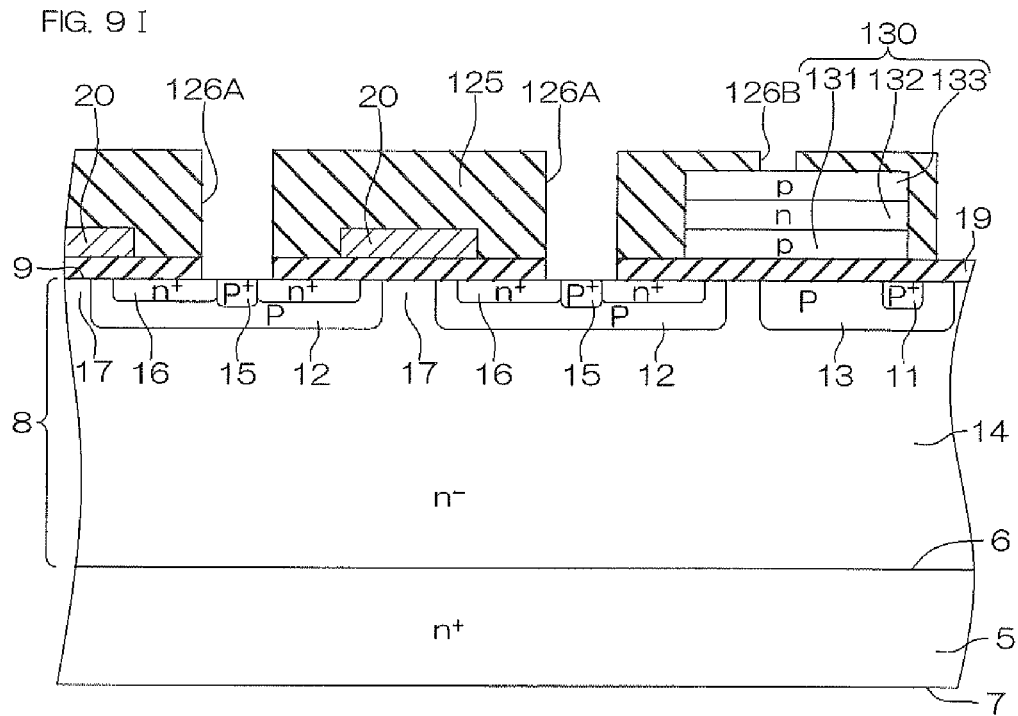
FIG. 9C is a sectional view showing a step subsequent to that of FIG. 9B.
FIG. 9D is a sectional view showing a step subsequent to that of FIG. 9C.
FIG. 9E is a sectional view showing a step subsequent to that of FIG. 9D.
FIG. 9F is a sectional view showing a step subsequent to that of FIG. 9E.
FIG. 9G is a sectional view showing a step subsequent to that of FIG. 9F.
FIG. 9H is a sectional view showing a step subsequent to that of FIG. 9G.
FIG. 9I is a sectional view showing a step subsequent to that of FIG. 9H.

Thereafter, as shown in FIG. 9B, a needless part (i.e., a part excluding a region in which the gate electrode 20 and the first p type region 131 of the gate protection diode 130 are to be formed) of the polysilicon material 81 deposited thereon is removed by dry etching. As a result, the region of the polysilicon material 81 in which the gate electrode 20 and the first p type region 131 are to be formed is left.

Thereafter, as shown in FIG. 9C, a p type impurity (e.g., B (boron)) is implanted into the polysilicon material 81 by use of an $SiO_2$ mask 82 that has an opening in a region in which the gate electrode 20 and the first p type region 131 of the gate protection diode 130 are to be formed. As a result, the gate electrode 20 and the first p type region 131 of the gate protection diode 130 are formed.

Thereafter, as shown in FIG. 9D, the polysilicon material 84 is deposited on the first p type region 131 according to the CVD method by use of an $SiO_2$ mask 83 that has an opening in a region (in which the n type region 132 is to be formed) corresponding to the first p type region 131 of the gate protection diode 130. In this case, the polysilicon material 84 is also deposited on the mask 83.

Thereafter, as shown in FIG. 9E, an n type impurity (e.g., P (phosphorus)) is implanted into the polysilicon material 84 deposited on the first p type region 131. As a result, the n type region 132 of the gate protection diode 130 is formed.

Thereafter, as shown in FIG. 9F, a polysilicon material 85 is deposited on the n type region 132 according to the CVD method. In this case, the polysilicon material 85 is also deposited on the mask 83.

Thereafter, as shown in FIG. 9G, a p type impurity (e.g., B (boron)) is implanted into the polysilicon material 85 deposited on the n type region 132. As a result, the second p type region 133 of the gate protection diode 130 is formed. As a result, the gate protection diode 130 including the first p type region 131, the n type region 132, and the second p type region 133 is formed. As described above, the first diode 130A is formed of the first p type region 131 and the n type region 132, whereas the second diode 130B is formed of the n type region 132 and the second p type region 133.

Thereafter, as shown in FIG. 9H, the interlayer insulating film 125 made of $SiO_2$ is stacked on the epitaxial layer 8 according to the CVD method.

Thereafter, as shown in FIG. 9I, the interlayer insulating film 125 and the gate insulating film 19 successively undergo patterning, and, as a result, the first contact hole 126A and the second contact hole 126B are formed.

Thereafter, for example, Ti, TiN, and Al are spattered on the interlayer insulating film 125 in this order, and the source electrode 127 is formed. Furthermore, for example, Ti, Ni, Au, and Ag are spattered on the reverse surface 7 of the SiC substrate 5 in this order, and the drain electrode 40 is formed.

Thereafter, an interlayer insulating film (not shown), the source pad, the gate pad, etc., are formed, and, as a result, the semiconductor device 1A shown in FIG. 2 can be obtained.

Figure 10:
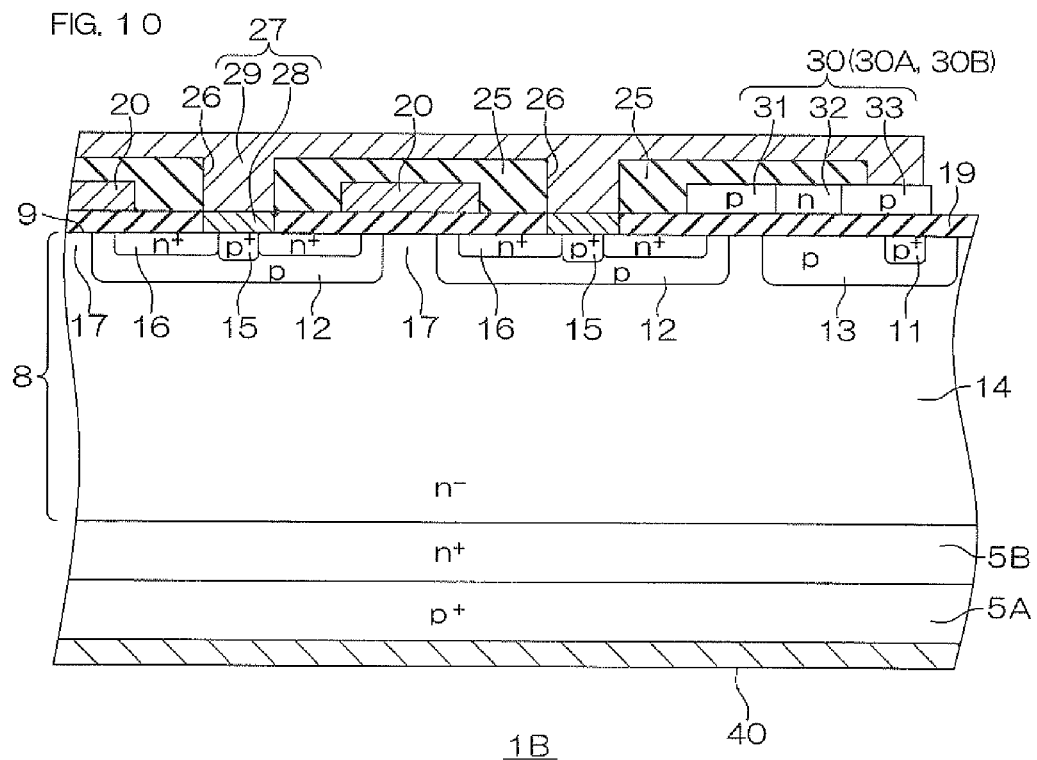
FIG. 10 is a schematic sectional view of a semiconductor device according to a third embodiment of the present invention.

FIG. 10 is a schematic sectional view of a semiconductor device according to a third embodiment of the present invention. In FIG. 10, the same reference sign as in FIG. 2 is given to a component equivalent to each component of FIG. 2.

The semiconductor device 1B is an IGBT (Insulated Gate Bipolar Transistor). The semiconductor device 1B is substantially the same in structure as the semiconductor device 1 shown in FIGS. 1A, 1B, and 2. In the semiconductor device 1B, a $p^+$ type SiC substrate 5A is used as a substrate. An epitaxial layer 5B made of $n^+$ type SiC is stacked on the SiC substrate 5A. An epitaxial layer 8 made of $n^-$ type SiC is stacked on the epitaxial layer 5B. In the semiconductor device 1B, an electrode 40 formed on the reverse surface of the SiC substrate 5A serves as a collector electrode, and an electrode 27 formed on the interlayer insulating film 25 serves as an emitter electrode.

A gate protection diode 30 is formed between the gate electrode 20 and the emitter electrode 27. The gate protection diode 30 is composed of the first p type region 31, the n type region 32, and the second p type region 33. The first diode 30A is formed of the first p type region 31 and the n type region 32, whereas the second diode 30B is formed of the n type region 32 and the second p type region 33.

In the semiconductor device 1B, an npn transistor portion is formed of the $p^+$ type SiC substrate 5A, the $n^+$ type epitaxial layer 5B, the $n^-$ type epitaxial layer 8, and the p type body region 12 in each unit cell. In each unit cell, an electric current is supplied to a base of the npn transistor portion by applying a positive voltage to the gate electrode 20, so that the npn transistor portion is turned on. As a result, the electric current flows between the collector and the emitter.

Figure 11:
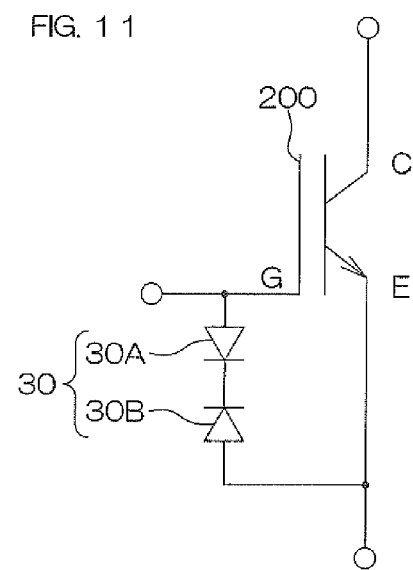
FIG. 11 is an electric circuit diagram of the semiconductor device shown in FIG. 10.

FIG. 11 is an electric circuit diagram of the semiconductor device 1B shown in FIG. 10.

The semiconductor device 1B is composed of an IGBT 200 and the gate protection diode 30 connected between the emitter E (emitter electrode 27) and the gate G (gate electrode 20) of the IGBT 200. The gate protection diode 30 includes the first diode 30A and the second diode 30B that are connected in anti-series to each other. The anode of the first diode 30A is connected to the gate G of the IGBT 200, whereas the cathode of the first diode 30A is connected to the cathode of the second diode 30B. The anode of the second diode 30B is connected to the emitter E of the IGBT 200.

The first diode 30A is designed so as to limit a negative voltage that is applied between the gate G and the emitter E to a voltage greater than a negative voltage in which the gate threshold value of the IGBT 200 varies greatly. In other words, the first diode 30A is designed so that a value obtained by giving a negative sign to its reverse breakdown voltage $V_{BR1}$ (i.e., negative second limited voltage $-V_{BR1}$) becomes a value greater than the aforementioned negative voltage in which the gate threshold value of the IGBT 200 varies greatly. More specifically, the first diode 30A is designed so that a value obtained by giving a negative sign to its reverse breakdown voltage $V_{BR1}$ (i.e., negative second limited voltage $-V_{BR1}$) becomes $-7$ V or more (e.g., $-7$ V).

The second diode 30B is designed so that its reverse breakdown voltage $V_{BR2}$ (positive first limited voltage) becomes greater than a threshold voltage for electrical conduction between the emitter E and the collector C of the IGBT 200, and becomes smaller than the withstand voltage of the gate insulating film 19. More preferably, the second diode 30B is designed so as to limit a positive voltage that is applied between the emitter E and the gate G of the IGBT 200 to a voltage smaller than a positive voltage in which the gate threshold value of the IGBT 200 varies greatly. More specifically, the second diode 30B is designed so that its reverse breakdown voltage $V_{BR2}$ (positive first limited voltage) becomes 20 V or more, and becomes 33 V or less (e.g., 33 V).

Figure 12:
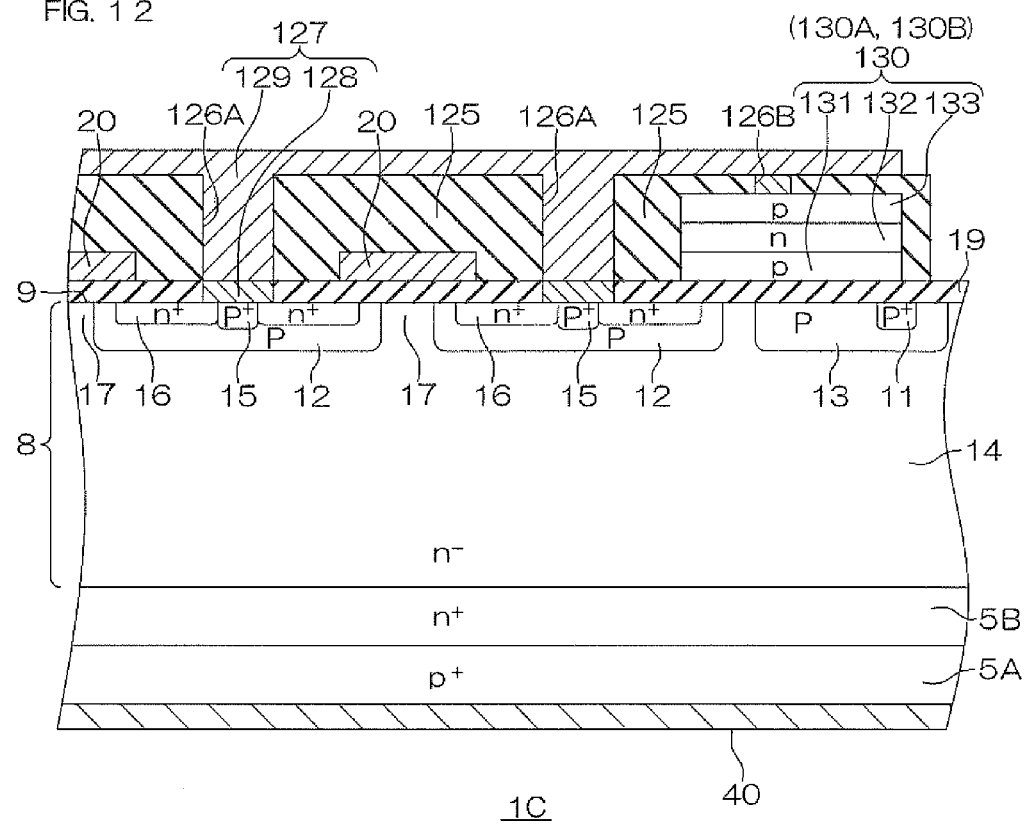
FIG. 12 is a schematic sectional view of a semiconductor device according to a fourth embodiment of the present invention.

FIG. 12 is a schematic sectional view of a semiconductor device according to a fourth embodiment of the present invention. In FIG. 12, the same reference sign as in FIG. 8 is given to a component equivalent to each component of FIG. 8.

The semiconductor device 1C is an IGBT. The semiconductor device 1C is substantially the same in structure as the semiconductor device 1A shown in FIG. 8. In the semiconductor device 1C, a $p^+$ type SiC substrate 5A is used as a substrate. An epitaxial layer 5B made of $n^+$ type SiC is stacked on the SiC substrate 5A. An epitaxial layer 8 made of $n^-$ type SiC is stacked on the epitaxial layer 5B. In the semiconductor device 1C, an electrode 40 formed on the reverse surface of an SiC substrate 201 serves as a collector electrode, and an electrode 127 formed on the interlayer insulating film 25 serves as an emitter electrode.

A gate protection diode 130 is formed between the gate electrode 20 and the emitter electrode 127. The gate protection diode 130 is composed of the first p type region 131, the n type region 132, and the second p type region 133. The first diode 130A is formed of the first p type region 131 and the n type region 132, whereas the second diode 130B is formed of the n type region 132 and the second p type region 133.

The first diode 130A is designed so that a value obtained by giving a negative sign to its reverse breakdown voltage $V_{BR1}$ (i.e., negative second limited voltage $-V_{BR1}$) becomes $-7$ V or more (e.g., $-7$ V). The second diode 130B is designed so that its reverse breakdown voltage $V_{BR2}$ (positive first limited voltage) becomes 20 V or more, and becomes 33 V or less (e.g., 33 V).

The present invention can be embodied in still another form although the four embodiments of the present invention have been described as above. For example, in the above embodiments, the two diodes 30A and 30B (130A and 130B) that are connected in anti-series to each other have their cathodes that are connected to each other, and yet their anodes may be connected to each other.

Additionally, as described above, in the above embodiments, each of the gate protection diodes 30 and 130 has a PNP structure composed of two diodes that are connected in anti-series to each other, and yet the present invention is not limited to this. For example, the gate protection diodes 30 and 130 may have a PNPNP structure.

Additionally, in the above embodiments, each of the semiconductor devices 1, 1A, 1B, and 1C is an SiC device, and yet the semiconductor device may be an Si device that uses Si (silicon) as a semiconducting material.

Although the embodiments of the present invention have been described in detail as above, these are merely specific examples used to clarify the technical contents of the present invention, and the present invention should not be understood as being limited to these examples, and the scope of the present invention is to be determined solely by the appended claims.

The present application corresponds to Japanese Patent Application No. 2010-207216 filed in the Japan Patent Office on Sep. 15, 2010, and the entire disclosure of the application is incorporated herein by reference.

REFERENCE SIGNS LIST 1,1A,1B,1C Semiconductor device
12 Body region
13 P type well region
14 Drift region
15 Body contact region
16 Source region
19 Gate insulating film
20 Gate electrode
25,125 Interlayer insulating film
26,126A,126B Contact hole
27,127 Source electrode (Emitter electrode)
31,131 First p type region
32,132 N type region
33,133 Second p type region
30A,130A First diode
30B,130B Second diode
40 Drain electrode (Collector electrode)

The invention claimed is:

1. A semiconductor device comprising:
a plurality of body regions having a source or an emitter region that is made of an SiC semiconductor, and a drain or a collector region that is made of an SiC semiconductor;
a well region that is annular when viewed planarly and surrounds the plurality of body regions;
a channel region that is made of an SiC semiconductor and that is disposed between the source or the emitter region and the drain or the collector region;
a gate that faces the channel region with a gate insulating film disposed between the gate and the channel region; and
a diode formed such that a part thereof faces a region between the well region and a region of the plurality of body regions nearest the well region, with the gate insulating film disposed therebetween;
wherein the diode is made of the same material as that of the gate and is connected between the gate and the source or the emitter region.

2. The semiconductor device according to claim 1, wherein the diode includes two diodes that are connected in anti-series to each other between the gate and the source or the emitter region.

3. The semiconductor device according to claim 1, wherein the diode is arranged so as to limit a voltage that is applied between the gate and the source or the emitter region.

4. The semiconductor device according to claim 1, wherein the diode is arranged so as to limit a voltage that is applied between the gate and the source or the emitter region to a voltage between a positive first limited voltage and a negative second limited voltage on a basis of the source or the emitter region, and an absolute value of the first limited voltage is determined to be greater than an absolute value of the second limited voltage.

5. The semiconductor device according to claim 1, wherein the diode is arranged so as to limit a voltage that is applied between the gate and the source or the emitter region to a voltage below a positive first limited voltage on a basis of the source or the emitter region, and the first limited voltage is determined to be greater than a threshold voltage for electrical conduction between the source or the emitter region and the drain or the collector region and to be smaller than a withstand voltage of the gate insulating film.

6. The semiconductor device according to claim 4, wherein the first limited voltage is 33 V or less.

7. The semiconductor device according to claim 4, wherein the second limited voltage is $-7$ V or more.

8. The semiconductor device according to claim 1, wherein the diode is made of a material composed mainly of Si.

9. The semiconductor device according to claim 1, wherein the diode is formed at an outer peripheral part of the semiconductor device.

10. The semiconductor device according to claim 2, wherein the diode is arranged so as to limit a voltage that is applied between the gate and the source or the emitter region.

11. The semiconductor device according to claim 2, wherein the diode is arranged so as to limit a voltage that is applied between the gate and the source or the emitter region to a voltage between a positive first limited voltage and a negative second limited voltage on a basis of the source or the emitter region, and an absolute value of the first limited voltage is determined to be greater than an absolute value of the second limited voltage.

12. The semiconductor device according to claim 2, wherein the diode is arranged so as to limit a voltage that is applied between the gate and the source or the emitter region to a voltage below a positive first limited voltage on a basis of the source or the emitter region, and the first limited voltage is determined to be greater than a threshold voltage for electrical conduction between the source or the emitter region and the drain or the collector region and to be smaller than a withstand voltage of the gate insulating film.

13. The semiconductor device according to claim 4, wherein the diode is arranged so as to limit a voltage that is applied between the gate and the source or the emitter region to a voltage below a positive first limited voltage on a basis of the source or the emitter region, and the first limited voltage is determined to be greater than a threshold voltage for electrical conduction between the source or the emitter region and the drain or the collector region and to be smaller than a withstand voltage of the gate insulating film.

14. The semiconductor device according to claim 11, wherein the diode is arranged so as to limit a voltage that is applied between the gate and the source or the emitter region to a voltage below a positive first limited voltage on a basis of the source or the emitter region, and the first limited voltage is determined to be greater than a threshold voltage for electrical conduction between the source or the emitter region and the drain or the collector region and to be smaller than a withstand voltage of the gate insulating film.

15. The semiconductor device according to claim 5, wherein the first limited voltage is 33 V or less.

16. The semiconductor device according to claim 11, wherein the first limited voltage is 33 V or less.

17. The semiconductor device according to claim 12, wherein the first limited voltage is 33 V or less.

18. The semiconductor device according to claim 1, wherein the diode is equal in thickness to the gate.

19. The semiconductor device according to claim 1, wherein a p type well region is formed so as to face the diode with the gate insulating film disposed therebetween.

* * * * *